(12) United States Patent
Kouvetakis et al.

(10) Patent No.: US 7,589,003 B2
(45) Date of Patent: *Sep. 15, 2009

(54) GESN ALLOYS AND ORDERED PHASES WITH DIRECT TUNABLE BANDGAPS GROWN DIRECTLY ON SILICON

(75) Inventors: John Kouvetakis, Mesa, AZ (US); Matthew Bauer, Hillsboro, OR (US); Jose Menendez, Tempe, AZ (US); Chang Wu Hu, Gilbert, AZ (US); Ignatius S. T. Tsong, Tempe, AZ (US); John Tolle, Gilbert, AZ (US)

(73) Assignee: Arizona Board of Regents, Acting for and on Behalf of Arizona State University, A Corporate Body Organized Under Arizona Law

( * ) Notice: Subject to any disclaimer, the term of this patent is extended or adjusted under 35 U.S.C. 154(b) by 0 days.

This patent is subject to a terminal disclaimer.

(21) Appl. No.: 10/559,981

(22) PCT Filed: Jun. 14, 2004

(86) PCT No.: PCT/US2004/018961

§ 371 (c)(1),
(2), (4) Date: Sep. 5, 2006

(87) PCT Pub. No.: WO2005/001902

PCT Pub. Date: Jan. 6, 2005

(65) Prior Publication Data

US 2007/0020891 A1    Jan. 25, 2007

Related U.S. Application Data

(60) Provisional application No. 60/478,480, filed on Jun. 13, 2003.

(51) Int. Cl.
*H01L 21/00* (2006.01)

(52) U.S. Cl. .............................. 438/507; 257/E21.092
(58) Field of Classification Search ................. 438/479, 438/492, 503, 507
See application file for complete search history.

(56) References Cited

U.S. PATENT DOCUMENTS 5,198,387 A    3/1993    Tang et al.

(Continued)

FOREIGN PATENT DOCUMENTS

JP    63108782 A    5/1988

(Continued)

OTHER PUBLICATIONS

D. W. Jenkins, "Electronic properties of metastable GexSn1-x alloys", Phys. Rev. B., vol. 36, pp. 7994-8001 (1987).

(Continued)

*Primary Examiner*—Alexander G Ghyka
*Assistant Examiner*—Reema Patel
(74) *Attorney, Agent, or Firm*—McDonnell Boehnen Hulbert & Berghoff LLP

(57) ABSTRACT

A method for depositing an epitaxial Ge—Sn layer on a substrate in a CVD reaction chamber includes introducing into the chamber a gaseous precursor comprising SnD4 under conditions whereby the epitaxial Ge—Sn layer is formed on the substrate. the gaseous precursor comprises SnD4 and high purity H2 of about 15-20% by volume. The gaseous precursor is introduced at a temperature in a range of about 250° C. to about 350° C. Using the process device-quality Sn—Ge materials with tunable bandgaps can be grown directly on Si substrates.

22 Claims, 7 Drawing Sheets

U.S. PATENT DOCUMENTS

| | | | |
|---|---|---|---|
| 5,532,183 | A | 7/1996 | Sugawara et al. |
| 5,548,128 | A * | 8/1996 | Soref et al. ............... 257/18 |
| 5,714,415 | A | 2/1998 | Oguro |
| 6,037,614 | A * | 3/2000 | He et al. ............... 257/184 |
| 6,410,434 | B1 | 6/2002 | Mani |
| 6,441,716 | B1 | 8/2002 | Doppalapudi et al. |
| 6,723,621 | B1 | 4/2004 | Cardone et al. |
| 6,849,878 | B2 * | 2/2005 | Bader et al. ............... 257/103 |
| 6,897,471 | B1 | 5/2005 | Soref et al. |
| 6,911,084 | B2 | 6/2005 | Kouvetakis et al. |
| 2002/0136932 | A1 * | 9/2002 | Yoshida ............... 428/698 |
| 2003/0157787 | A1 | 8/2003 | Murthy et al. |
| 2003/0219933 | A1 * | 11/2003 | Yamauchi et al. ............ 438/156 |
| 2006/0134895 | A1 | 6/2006 | Kouvetakis et al. |
| 2006/0163612 | A1 | 7/2006 | Kouvetakis et al. |
| 2006/0236923 | A1 | 10/2006 | Kouvetakis et al. |

FOREIGN PATENT DOCUMENTS

| | | |
|---|---|---|
| WO | WO 03/033781 | 4/2003 |
| WO | WO 2004/114368 | 12/2004 |
| WO | WO 2005/001902 | 1/2005 |
| WO | WO 2005/015609 | 2/2005 |
| WO | WO 2006/009171 | 1/2006 |

OTHER PUBLICATIONS

K. A. Mader, "Band structure and instability of GexSn1-x alloys", Solid State Commun., vol. 69 (12), pp. 1123-1126 (1989).

G. He and H.A. Atwater, "Interband transitions in $Sn_xGe_{1-x}$ Alloys", Phys. Rev. Lett., vol. 79(10), pp. 1937-1940 (1997).

O. Gurdal, R. Desjardins, J. R. A. Carlsson, N. Taylor, H. H. Radamson, J.-E. Sundgren, and J. E. Greene, "Low-temperature growth and critical epitaxial thickness of fully strained metastable Ge1-x Snx (x $\leq$0.26) alloys", J. Appl. Phys., vol. 83(1), pp. 162-170 (1998).

M. T. Asom, E. A. Fitzgerald, A. R. Kortan, B. Spear, and L. C. Kimerling, "Epitaxial Growth of SnGe Alloys", Appl. Phys. Lett., vol. 55(6), pp. 578-580 (1989).

H. Höchst, M. A. Engelhardt, and D. W. Niles, "The MBE growth and electronic structure of $\alpha$-$Sn_xGe_{1-x}$ alloys", SPIE Proceedings, vol. 1106, pp. 165-171 (1989)(Abstract).

C. A. Hoffman, et al., "Three-Band transport and cyclotron resonance in alpha -Sn and alpha -$Sn_{1-x}Ge_x$ grown by molecular-beam epitaxy", Phys. Rev. B. vol. 40(17): pp. 11693-11700, (1989).

W. Wegscheider, K. Eberl, U. Menczigar, and G. Abstreiter, "Single-crystal Sn/Ge superlattices on Ge substrates: Growth and structural properties", Appl. Phys. Lett., vol. 57(9), pp. 875-877 (1990).

O. Gurdal, et al., "Growth of metastable $Ge_{1-x}Sn_x$/Ge stratined layer superlattices on Ge(001)2x1 by temperature-modulated molecular beam epitaxy", Appl. Phys. Lett., vol. 67(7), pp. 956-958 (1995).

P. R. Pukite, A. Harwit, and S. S. Iyer, "Molecular beam epitaxy of metastable, diamond structure $Sn_xGe_{1-x}$ alloys", Appl. Phys. Lett. 54(21), pp. 2142-2144 (1989).

M. Bauer, et al., "Ge-Sn semiconductors for band-gap and lattice engineering", Appl. Phys. Lett. 81(16), pp. 2992-2994 (2002).

L. Bellaiche, S.-H. Wei and Z. Zunger, "Localization and percolation in semiconductor alloys: GaAsN vs GaAsP", Phys. Rev. B 54, 17568-17576 (1996).

J. Taraci, J. Tolle, M. R. M. Cartney, J. Menendez, M. A. Santana, D. J. Smith, and J. Kouvetakis, "Simple chemical routes to diamond-cubic germanium-tin alloys", App. Phys. Lett. 78(23), pp. 3607-3609 (2001).

J. Taraci, S. Zollner, M. R. McCartney, J. Menéndez, M. A. Santana, D. J. Smith, A. Haaland, A. V. Tutukin, G. Gundersen, G. Wolf, and J. Kouvetakis, "Synthesis of silicon-based infrared semiconductors in the Ge-Sn system using molecular chemistry methods", J. of the Am. Chem. Soc., col. 123(44), pp. 10980-10987 (2001).

V. Atluri, N. Herbots, D. Dagel, H. Jacobsson, M. Johnson, R. Carpio, and B. Fowler, "Comparison and reproducibility of H-passivation of Si(1000) with HF in methanol, ethanol, isopropanol and water by IBA, TMAFM, and FTIR", Mater. Res. Soc. Symp. Proc. 477, pp. 281-292 (1997) (Abstract).

Z. Charafi and N. Bouarissa, "The effect of the violation of Vegard's law on the optical bowing in $Si_{1-x}Ge_x$ alloys", Phys. Lett. A. vol. 234, pp. 493-497 (1997).

H. Kajiyama, S-I. Muramatsu, T. Shimada, and Y. Nishino, "Bond-length relaxation in crystalline $Si_{1-x}Ge_x$ alloys: An extended x-ray-absorption fine-structure study", Phys. Rev. B vol. 45(24), pp. 14005-14010 (1992).

F. Cerdeira, W. Dreyrodt, and M. Cardona, "Resonant raman scattering in germanium", Solid State Commun., vol. 10, 591-595 (1972).

M.M. McGibbon, N.D. Browning, M.F. Chisholm, A.J. McGibbon, S.J. Pennycook, V. Ravikumar, V.P. Dravid, "Direct determination of grain boundary atomic structure in $SrTiO_3$," Science, vol. 266, pp. 102-104 (1994).

P. Mock, T. Topuria, N. D. Browning, G. R. Brooker, N. J. Mason, R. J. Nicholas, M. Dobrowolska, S. Lee, and J. K. Furdyna, "Internal self-ordering in In(Sb,As), (In,Ga) Sb, and (Cd,Zn,Mn) Se nano-agglomerates/quantum dots", Appl. Phys. Lett., vol. 79(7), pp. 946-948. (2001).

D.M. Ceperley, B.J. Alder, "Ground State of the Electron Gas by Stochastic Method", Phys. Rev. Lett., vol. 45, pp. 566-569 (1980).

T G. Kresse and J. Hafner, "Ab initio molecular dynamics for liquid metals", Phys. Rev. B47(1), pp. R558-561 (1993).

G. Kresse and J. Hafner, "Ab ignition molecular dynamics simulation of the liquid-metal-amorphous-semiconductor transition in germanium", Phys. Rev. B49(20), pp. 14251-14269 (1994).

G. Kresse, J. Furthmuller, "Efficiency of ab-initio total energy calculations for metals and semiconductors using a plane-wave basis set", Comput. Mater. Sci. vol. 6, pp. 15-50 (1996).

G. Kresse, J. Furthmuller, "Efficient iterative schemes for ab initio total-energy calculations using a plane-wave basis set", Phys. Rev. B54(16), pp. 11169-11186 (1996).

R. A. Soref and L. Friedman, "Direct-gap Ge/GeSn/Si and GeSn/Ge/Si heterostructures", Superlattices and Microstructures, vol. 14(2), 189-193 (1993).

M. R. Bauer, J. Kouvetakis, D.J. Smith and J. Menendez, "Tunable band structure in diamond cubic tin germanium alloys grown on Si", Solid State Commun., vol. 127, 355-359 (2003).

M.R. Bauer, P. Crozier, A.V.G Chizmeshya and J. D. Smith and J. Kouvetakis, "GeSn superstructured materials for Si-based optoelectronics", Appl. Phys. Lett. vol. 83, pp. 3489-3491 (2003).

M. Bauer et al., "Tunable band structure in diamond-cubic tin-germanium alloys grown on silicon substrates", Solid State Communications, vol. 127 (2003), pp. 355-359.

S. Cradock, E. A. V. Ebsorth, G. Davidson, L. A. Woodard, "Studies in Germyl Chemistry.3. Trigermylphosphine", J. Chem. Soc. A, 8, pp. 1229-1233 (1967).

D. W. H. Rankin, A. G. E. Robiet, G. M. Sheldrick, 5 Beagley, T. G. Hewit, "An electron Diffraction of the Molecular Structures of Trigermylphosphine and Trisilylstibine in the Gas Phase" J. Inorg. Nucl. Chem., 31, pp. 2351-2357 (1969).

E. A. V. Ebsworth, D. J. Hutchison, D. W. H. Rankin, "The Preparation, properties, and Gas-Phase Molecular-Structure of 1,1-Difluoro-2,2-Digermylbiphosphone",J. Chem. Res., Synop, 12, pp. 393, (1980).

E. A. V. Ebsworth, D. W. H. Rankin, G. M. Sheldrick, "Preparation and Properties of Trigermyl-arsine and -stibine", J. Chem. Soc. A, 11, pp. 2828-2830 (1968).

D. E. Wingeleth, A. D. Norman, "Redistribution of primary silyl-and germylphosphines; synthesis of trisilyl-and trigermylphosphines", Phosphorus Sulfur, 39(1-2), pp. 123-129, (1988).

G. A. Forsyth, D. W. H. Rankin, H. E. Robertson, "Determination of the molecular structure of Tris (Trimethylsilyl) phosphine in the gas phase by electron diffraction, supported by molecular mechanics calculations", J. Mol. Struct., vol. 239, pp. 209-217, (1990).

H. Schumann, H. J. Kroth, "NMR-Untersuchungen an Organoelementen(IVb)-Phosphinen, 2. Substituenteneinflusse auf die P-chemischen Verschiebungen von Trimethylelement (IVb)-phosphinen", Z. Naturforsch., B: Anorg. Chem., Chem. 32B, pp. 513-515, (1977).

G. Becker, H. Freudenblum, O. Mundt, M. Reti, M. Sachs, Synthetic Methods of Organometallic and Inorganic Chemistry, 3, pp. 193-198 (1996).

S. Schulz, M. Nieger, "Synthesis and characterization of organogallium-antimony compounds", J. of Organomet. Chem., vol. 570, pp. 275-278 (1998).

H. Schumann, U. Frank, W. W. Du Mont, F. Marschner, "Organometallarsine", J. Organomet. Chem, vol. 222, pp. 217-225 (1981).

M. Ates, H. J. Breunig, M. Denker, "Formation of $(Me_3M)_3Sb$ (M=Ge, Sn, Pb) and $(Me_3M)_4Sb_2$ (M=Pb) by reaction of $(Me_3Si)_3Sb$ with $Me_3MCl$", Phosphous, Sulfur Silicon Relate. Elem., vol. 102, pp. 287-289 (1995).

H. Schumann, A. Roth, O. Stelzer, M. Schmidt, "Pyramidenformige Molekule Mit Dem Atomskelett", Inorg. Nucl. Chem. Lett. 2, pp. 311-312, (1986).

G. Davidson, L. A. Woodward, E. A. V. Ebsworth, G. M. Sheldrick, "The vibrational spectra and structure of trisilylarsine and trisilylstibine", Spectrochim. Acta, Part A, vol. 23, pp. 2609-2616, (1967).

B. Beagley, A. G. Robiette, G. M. Sheldrick, "The Molecular Structures of (SiH3)3P and (SiH3)3As", Chem. Commun, 12, pp. 601-602 (1967).

A. Blake, E. A. V. Ebsworth, S. G. D. Henderson, "Structure of trisilylphosphine, $P(SiH_3)_x$, at 100 K", Acta Crystallogr., Sect. C: Cryst. Struct. Commun, C47, pp. 486-489, (1991).

H. Siebert, J. Eints, "Neuvermessung des schwingungsspektrums von trisilylphosphin", J. Mol. Struct. vol. 4, pp. 23-28, (1969).

D. C. McKean, "On the spectroscopic evidence for geometry in $(SiH_3)_3P$ and $(SiH_3)_3As$", Spectrochim. Acta, Part A, vol. 24A, pp. 1253-1254 (1968).

J. E. Drake, J. Simpson, "Reactions of Monosilylarsine with Some Boron Lewis Acids and the Reaction of Monosilylphosphine with Boron Tribromide", J. Chem. Soc. A. 5, pp. 1039-1043 (1968).

E. H. Parker and T. E. Whall, "SiGe heterostructure CMOS circuits and applications", Solid State Electronics 43(8), pp. 1497-1506 (1999).

R. A. Soref and C. H. Perry, "Predicted band gap of the new semiconductor SiGeSn", J. Appl. Phys. 69, pp. 539-541 (1991).

K. A. Johnson and N. W. Aschroft, "Electronic structure of ordered silicon alloys: Direct-gap systems", Phys. Rev. B 54, pp. 14480-14486 (1996).

A. R. Kost, in Infrared-Applications-of-Semiconductors-II. Symposium, (Mater. Res. Soc., 1998). pp. 3-10 (Abstract).

A. W. Bett, F. Dimroth, G. Stollwerck, and O. V. Sulima, "III-V compounds for solar cell applications", Appl. Phys. A: materials Science & Processing, vol. 69(2), pp. 119-129 (1999).

R. Gaska, A. Zukauskas, M. S. Shur, and M. A. Khan, "Progress in III-nitride based white light sources", Proceedings of the SPIE, vol. 4776, pp. 82-96 (2002).

R. Bauer, C. Ritter, P. Crozier, J. Menendez, J. Ren, and J. Kouvetakis, "Synthesis of ternary Si-Ge-Sn semiconductors on Si(100) via SnxGe1-x buffer layers", Appl. Phys. Lett. 83 (11), 2163-2165 (2003).

H.K. Shin, D.J. Lockwood, J.-M. Baribeau, "Strain in coherent-wave SiGe/Si superlattices", Solid State Commun., vol. 114(10), pp. 505-510 (2000).

M. Meléndez-Lira, J. D. Lorentzen, J. Menéndez, W. Windl, N. Cave, R. Liu, J. W. Christiansen, N. D. Theodore, and J. J. Candelaria, "Microscopic carbon distribution in $Si_{1-y}C_y$ alloys: A Raman scattering study", Phys. Rev. B 56, pp. 3648-3650 (1997).

C.S. Cook, S. Zollner, M.R. Bauer, P. Aella, J. Kouvetakis, and J. Menendez, "Optical constants and interband transitions of $Ge_{1-x}Sn_x$ alloys (x <0.2) grown on Si by UHV-CVD", Thin Solid Films 455-456, pp. 217-221 (2004).

Chizmeshya, et al., "Experimental and Theoretical study of deviations from Vegards Law in the $Ge_{1-x} Ge_{1-x}$ system", Chem. Of Matls., vol. 15, pp. 2511-2519 (2003).

Aella, et al., "Structural and optical properties of $Sn_xSi_yGe_{1-x-y}$ alloys", App. Phys. Lett. vol. 84, pp. 888-890 (2004).

Roucka, et al., "Versatile buffer layer architectures based on $Ge_{1-x}Sn_x$ alloys", Appl. Phys. Let. vol. 86(19), pp. 191912-191914 (2005).

He, et al., "Synthesis of expitaxial $Sn_xGe_{1-x}$ alloy films by ion-assisted molecular beam epitaxy", App. Phys. Lett., vol. 68(5), pp. 664-666 (1996).

Pristovsek, et al., "Growth of strained gaAsSb layers on GaAs (001) by MOVPE", Journal of Crystal Growth, vol. 276, pp. 347-353 (2005).

Wosinski, et al., "Deep levels caused by misfit dislocations in gaAsSb/GaAs heterostructures", Appl. Phys. Lett., vol. 67(8), pp. 1131-1133.

Dvorak, et al., "300 GHz InP/GaAsSb/InP double HBTs with high current capability and BVCEO < 6V", IEEE Electron Device Letters, vol. 22(8), pp. 361-363 (2001).

Ryu Sang-Wan, et al., "Optical characterization and determination of conduction band offset of type-II GaAsSb/InGaAs QW", Semiconductor Science and Technology, vol. 19, pp. 1369-1372 (2004).

Dowd, et al., "Long wavelength GaAsP/GaAs/GaAsSb VCSELs on GaAs substrates for communication applications", Electronics Letters, vol. 39(13), pp. 987-988 (2003).

Zheng, et al., "Demonstration of High-Speed staggered lineup GaAsSb-InP Unitraveling Carrier Photodiodes", IEEE Photonics Technology Letters, vol. 17(3), pp. 651-653 (2005).

Sun, et al., "GaAsSb: a novel material for near infrared photodetectors on GaAs substrates", Selected Topics in Quantum Electronics, IEEE Journal, vol. 8(4), pp. 817-822 (2002).

Kaniewski J., et al., "Resonant cavity enhanced InGaAs photodiodes for high speed detection of 1.55 µm infrared radiation", Proceedings of SPIE—The International Society for Optical Engineering (2005), vol. 5783 (Pt. 1, Infrared Technology and Applications XXXI), pp. 47-56.

Kang, Y., et al., "InGaAs-on-Si single photon avalanche photodetectors", Applied Physics Letters (2004), 85(10), pp. 1668-1670.

Kim S., et al., "High Performance 0.1µm GaAs Pseudomorphic High Electron Mobility Transistors with Si Pulse-Doped Cap Layer for 77GHz Car Radar Applications", Jpn. J. App. Phys. 44, pp. 2472-2475 (2005).

Cristea P., et al., "Growth of AlAsSb/InGaAs MBE-layers for all-optical switches", J. Cryst. Growth 278(1-4), pp. 544-547 (2005).

Li Y.J., et al., "Improved characteristics of metamorphic InAlAs/InGaAs high electron mobility transistor with symmetric graded $In_xGa_{1-x}As$ channel", J. of Vac. Sci. Tech. B 22(5), pp. 2429-2433 (2004).

Mao R. W., et al., "Fabrication of 1.55 µm Si-Based Resonant Cavity Enhanced Photodetectors Using Sol-Gel Bonding" IEEE Photonics Technology Letters 16(8), pp. 1930-1932 (2004).

Pauchard A., et al., "Wafer-bonded InGaAs/silicon avalanche photodiodes", Proceedings of SPIE-The International Society for Optical Engineering, vol. 4650 (Photodetector Materials and Devices VII), pp. 37-43 (2002).

Takano, Y., et al., "Residual strain and threading dislocation density in InGaAs layers grown on Si substrates by metalorganic vapor-phase epitaxy", Appl. Phys. Lett., vol. 78(1), pp. 93-95 (2001).

Chriqui Y., et al., "Long wavelength room temperature laser operation of a strained InGaAs/GaAs quantum well structure monolithically grown by metalorganic chemical vapour deposition on a low energy-plasma enhanced chemical vapour deposition graded misoriented Ge/Si virtual substrate", Optical Materials, vol. 27, pp. 846-850 (2005).

V.K. Yang, et al., "Comparison of luminescent efficiency of InGaAs quantum well structures grown on Si, GaAs, Ge, and SiGe virtual substrate", J. Appl. Phys., vol. 93(9), pp. 5095-5102 (2003).

Shiu Fai Li, et al., Scaling law for the compositional dependence of Raman frequencies in GeSi and SnGe alloys, Appl. Phys. Lett., vol. 84, pp. 867-869 (2004).

Cook, et al., "Optical constants and interband transitions of Ge1-xSnx alloys (x<0.2) grown on Si", In press Thin Solid Films, vol. 455-456, pp. 217-221 (2004).

Menendez, et al., Type-I $Ge/Ge_{1-x-y} Si_xSn_y$ strained-layer heterostructures with a direct Ge band gap, Appl. Phys. Lett., vol. 85(7), pp. 1175-1177 (2004).

Park, et al., "Observation olarge stark shift in $Ge_xSi_{1-x}$ /Si multiple quantum wells", J. Cac. Sci. Technol. B, vol. 8(2), pp. 217-220 (1990).

Baier, et la., "Type-II band alignment in Si/Si1_xGex quantum wells from photoluminescence line shifts due to optically induced band-bending effects: Experiment and theory", Phys. Rev. B, vol. 50(20), pp. 15191-15196 (1994).

Temkin, et al., "GexSi1-x strained-layer superlattice waveguide photodetectors operating near 1.3_m", Appl. Phys. Lett., vol. 48(15), pp. 963-965 (1986).

Li, et al., (2000), "Observation of quantum-confined stark shifts in SiGe/Si type-I multiple quantum wells", J. Appl. Phys. vol. 87(11), pp. 8195-8197.

Miyake, et al., "Absence of stark shift in strained Si1-xGex/Si type-I quantum wells", Appl. Phys. Lett., vol. 68(15), pp. 2097-2099 (1996).

O. Qasaimeh, et al., (1997), "Electroabsorption and Electrooptic Effectin SiGe-Si Quantum Wells: Realization of Low-Voltage Optical Modulators", IIEEE J. Quantum Electron, vol. 33 (99), pp. 1531-1536.

Jaros, "Simple analytic model for heterojunction band offsets", Phys. Rev. B. vol. 37(12), pp. 7112-7114 (1988).

Tolle, et al., "Epitaxial growth of group III nitrides on Si substrates via a reflective lattice-matched zirconium diboride buffer layer", Appl. Phys. Lett., vol. 82(15), pp. 2398-2400 (2003).

Hu, et al., "Nucleation and growth of epitaxial $ZrB_2(0001)$ on Si(111)", Journal of Crystal Growth, vol. 267, (2004), pp. 554-563.

Tolle, et al., "Epitaxial growth of AlGaN by metalorganic chemical vapor deposition on Si(111) via a $ZrB_2(0001)$ buffer layer", Appl. Phys. Lett, vol. 84(18), pp. 3510-3512 (2004).

R.F.C. Farrow et al., "The growth of metastable, heteroepitaxial films of α-Sn by metal beam epitaxy", J. Cryst. Growth, vol. 54, pp. 507-518 (1981).

G Becker et al., "Notiz uber eine einfache methode zur darstellung von tris (trimethylsilyl)phosphin", Chem. Ber., vol. 108, pp. 2484-2485 (1975).

H. Schumann et al., "Trimethylsilyldiphosphane", J. Organomet. Chem., vol. 88, pp. C13-C16, (1975).

H. Schumann et al., "Eine einfache Methode zur Synthese von Organosilylphosphinen", J. Organometalic Chem., vol. 55, pp. 257-260 (1973).

H. Burger et al., "Schwingungsspektren und Kraftkonstanten von Silyl-und Trimethylsilyl-Verbindungen von Elementen der 5. Gruppe", Spectrochimica. Acta, vol. 26A, pp. 671-683, (1970).

H.J. Breunig et al., "Crystal structures of tris (trimethylsilyl) stibine and pentacarbonyl(tris(trimethylsilyl) stibine) chromium", Journal of Organometallic Chemistry, vol. 608 (2000), pp.60-62.

L. Rosch et al., "Darstellung und untersuchung von phosphinkomplexen mit aluminiumtrichlorid und aluminiumtriathyl", Anorg. Allg. Chem, vol. 426, pp. 99-106 (1976).

H. Schumann et al., "Substituentenaustauschreaktionene zwischen Tris (Trimethylsilyl) phosphan und Trimethylgermanium- und Trimethylzinnchlorid", Z. Naturforsch., vol. 29B, 608-610 (1974).

H. Schumann et al., "Darstellung und Schwingungsspektren von Trimethylsilyl-, Trimethylgermyl-und Trimethyl-stannyl-tert-butylphosphinen", Chem. Ber., vol. 107, pp. 854-869 (1974).

A.V.G. Engelhardt et al. Naturforsch., "Über die IR-, Raman-und $^{31}$P-NMR-Spektren ciniger phosphinderivate von germanium und zinn", B: Anorg. Chem., Org. Chem., Biochem, Biophys., Biol. vol. 22b, pp. 352-353 (1967).

J.W. Anderson, J.E. Drake, "Trimethylstannylarsines", Canadian Journal of Chemistry, vol. 49, pp. 2524-2528 (1971).

E. Niecke, H. Westermann, "A simple method for the preparation of Tris (trimethylsilyl) phosphine", Synthesis, (1988), p. 330.

H.J. Breunig et al., Naturforsch., "Tetrakis (Trimethylsilyl) distiban", Z. Naturforsch., vol. 34B, pp. 926-928 (1979).

H.J. Breunig, "Synthese von Tetrakis (trimethylgermyl)-Distaiban", Z. Naturforsch., vol. 33B, pp. 244-245, (1978).

Spanier, et al., "The Synthesis of Germylsilane from Silane and German in a Silent Electric Discharge", Inorganic Chemistry, (1962), pp. 215-216.

Kouvetakis, et al., U.S. Appl. No. 10/559,980, filed Dec. 8, 2005.
Kouvetakis, et al., U.S. Appl. No. 10/559,979, filed Dec. 8, 2005.

* cited by examiner

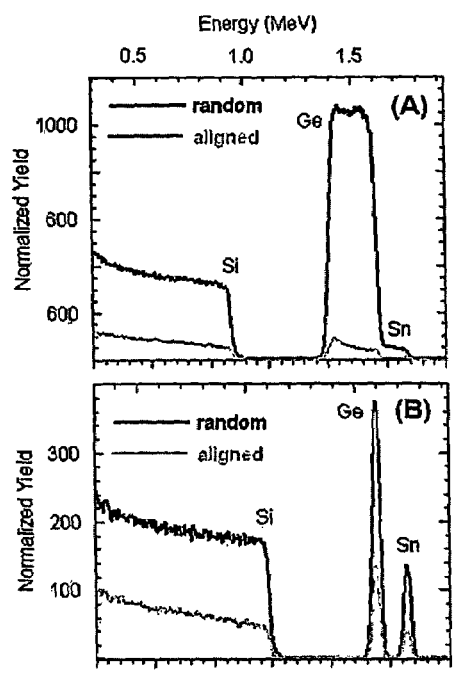
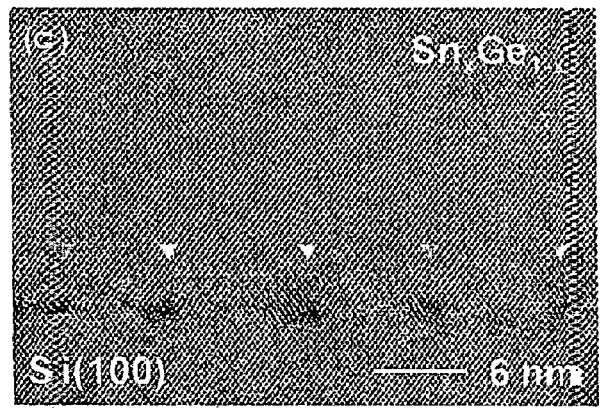
FIG. 1
FIG. 2
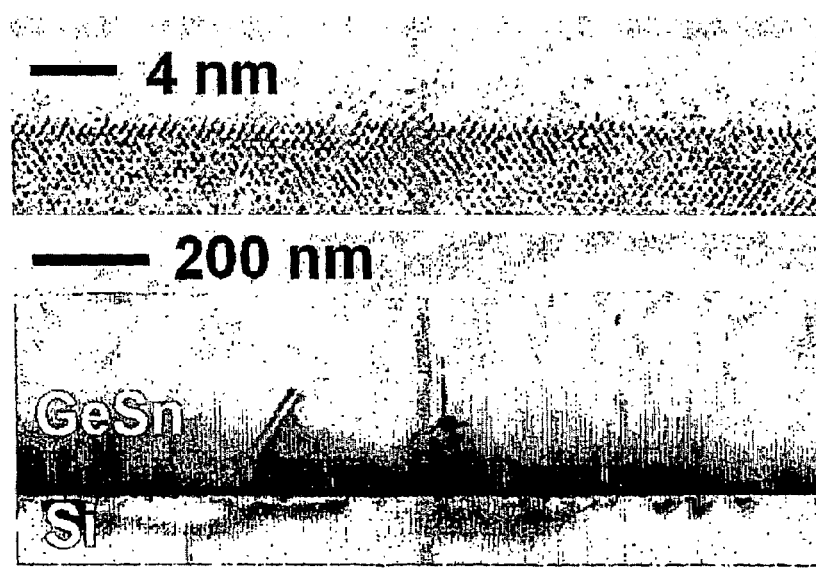
FIG. 3

GESN ALLOYS AND ORDERED PHASES WITH DIRECT TUNABLE BANDGAPS GROWN DIRECTLY ON SILICON

RELATED APPLICATION DATA

This application is based on and claims the benefit of U.S. Provisional Patent Application No. 60/478,480 filed on Jun. 13, 2003, the disclosure of which is incorporated herein by this reference.

STATEMENT OF GOVERNMENT FUNDING

The United States Government provided financial assistance for this project through the National Science Foundation under Grant No. DMR 0221993 and through the Army Research Office under Grant No. DAA 19-00-0-0471. Therefore, the United States Government may own certain rights to this invention.

BACKGROUND

This invention relates generally to semiconductor materials and, more particularly, to a method for growing direct-gap GeSn epilayers and nanostructures directly on silicon substrates.

Light-emitting semiconductor devices rely on materials that possess direct band gaps. Interestingly, none of the elemental group-IV materials are direct-gap semiconductors: diamond, silicon, and germanium have indirect band gaps, and cubic α-tin is a zero-gap semi-metal. Compounds based on these elements, such as SiC and the $Si_{1-x}Ge_x$ alloys, are also indirect-gap semiconductors. It has been recognized that the $Si_{1-x}Ge_x$ system is a nearly ideal semiconductor alloy, with a lattice constant and interband optical transition energies that are essentially linear functions of x. See O. Madelung, *Semiconductors—basic data* (Springer, Berlin, New York, 1996). Because these semiconductors have indirect band gaps, however, the have been precluded from use as active layers in light-emitting diodes and lasers.

It has also been recognized, on theoretical grounds, that the group-IV $Sn_xGe_{1-x}$ system is a possible exception to the indirect band gap behavior of group IV materials. The band gap of the $Sn_xGe_{1-x}$ alloy is expected to undergo an indirect-to-direct transition, since the direct band gap has a value of 0.81 eV in Ge and becomes negative (−0.4 eV) in gray (α-) Sn. See M. L. Cohen and J. R. Chelikowsky, *Electronic Structure and Optical Properties of Semiconductors* (Springer, Heidelberg, Berlin, New York, 1989). A linear interpolation between Ge and α-Sn places the crossover at x=0.2, and this simple estimate agrees remarkably well with detailed electronic structure calculations within the virtual crystal approximation. See D. W. Jenkins and J. D. Dow, Phys. Rev. B 36, 7994 (1987); K. A. Mader, A. Baldereschi, and H. von Kanel, Solid State Commun. 69, 1123 (1989).

This knowledge has stimulated intense experimental efforts to grow $Sn_xGe_{1-x}$ compounds that are of high enough quality to be used for microelectronic and optical device applications. These efforts, however, have previously been hampered for a number of reasons. There is an enormous lattice mismatch (15%) between Ge and α-Sn, and the cubic α-Sn structure is unstable above 13° C. As a result, the system is highly metastable and cannot be produced in bulk form. Efforts have been made to grow metastable films of $Sn_xGe_{1-x}$ by molecular-beam epitaxy (MBE). See G. He and H. A. Atwater, Phys. Rev. Lett. 79, 1937 (1997); O. Gurdal, R. Desjardins, J. R. A. Carlsson, N. Taylor, H. H. Radamson, J.-E. Sundgren, and J. E. Greene, J. Appl. Phys. 83, 162 (1998); M. T. Asom, E. A. Fitzgerald, A. R. Kortan, B. Spear, and L. C. Kimerling, Appl. Phys. Lett. 55, 578 (1989). A major problem encountered in the MBE approach, however, is the low thermal stability of the materials and the propensity of Sn to segregate toward the film surface.

Some progress has been made, as described by H. Höchst, M. A. Engelhardt, and D. W. Niles, SPIE Proceedings 1106, 165 (1989) and C. A. Hoffman, et al., Phys. Rev. B 40, 11693 (1989), but the large compositional dependence of the lattice constant limits this approach to a narrow range of compositions near the Sn-rich end. For the Ge-rich $Ge_{1-x}Sn_x$ alloys, which are of more interest technologically, pure Ge is an obvious choice as a substrate, and in fact fully strained $Sn_n$-$Ge_m$ superlattices as well as random $Ge_{1-x}Sn_x$ alloys on Ge have been demonstrated. See W. Wegscheider, K. Eberl, U. Menczigar, and G. Abstreiter, Appl. Phys. Lett. 57, 875 (1990); O. Gurdal, et al., Appl. Phys. Lett. 67, 956 (1995). Unfortunately, a major disadvantage of Ge substrates is that tetragonally distorted $Ge_{1-x}Sn_x$ films on Ge are not expected to display an indirect-to-direct transition. Ge-rich $Sn_xGe_{1-x}$ films have been grown on Si substrates using Ge buffer layers. See P. R. Pukite, A. Harwit, and S. S. Iyer, Appl. Phys. Lett. 54, 2142 (1989); G. He and H. A. Atwater, Phys. Rev. Lett. 79, 1937 (1997). The optical properties of these MBE-grown films, however, differ very markedly from those observed in conventional semiconductor alloys: individual interband transitions are not observed, and the position of the band edges is obtained from fits that must incorporate transitions not found in pure Ge.

There is a need, therefore, for a method of growing direct gap, device-quality $Sn_xGe_{1-x}$ alloys directly on Si substrates without using buffer layers. It is an object of the present invention to provide such a method and semiconductor structure with a well defined Ge-like band structure.

It is another object of the present invention to such a method that is practical to implement and that can be used to produce such semiconductor structures in bulk device quality form.

Additional objects and advantages of the invention will be set forth in the description that follows, and in part will be apparent from the description, on may be learned by practice of the invention. The objects and advantages of the invention may be realized and obtained by the instrumentalities and combinations pointed out herein.

SUMMARY OF THE INVENTION

To achieve the foregoing objects, and in accordance with the purposes of the invention as embodied and broadly described in this document, we provide a novel process for synthesizing device-quality alloys and ordered phases in a Sn—Ge system using an ultra-high vacuum (UHV) chemical vapor deposition (CVD) process. The process is based on precursor CVD, in which growth mechanisms and surface kinetics are substantially different than those inherent to MBE processes. The process can be used to generate new materials (i.e., epilayers and nanostructures) that cannot be created by conventional CVD and MBE routes.

According to one aspect of the invention, we provide a method for depositing an epitaxial Ge—Sn layer on a substrate in a CVD reaction chamber. The method includes introducing into the chamber a gaseous precursor comprising $SnD_4$ under conditions whereby the epitaxial Ge—Sn layer is formed on the substrate. Preferably, the gaseous precursor comprises $SnD_4$ and high purity $H_2$ of about 15-20% by volume. The gaseous precursor is introduced at a temperature in a range of about 250° C. to about 350° C.

Using the process of our invention, we have grown device-quality Sn—Ge materials directly on Si substrates. The Ge—Sn layer can comprise $Sn_xGe_{1-x}$, where x is in a range from about 0.02 to about 0.20. The substrate can comprise silicon, such as Si(100). We have determined the optical properties of strain-free $Ge_{1-x}Sn_x$ films grown directly on Si. Unlike previous results reported by others, our films show clear evidence for a well-defined Ge-like band structure and interband transitions consistent with a group IV material, demonstrating that $Ge_{1-x}Sn_x$ alloys are viable candidates for a variety of novel devices based solely on group-IV materials.

Thus, the method of our invention can be used to fabricate novel Ge—Sn semiconductor materials with tunable band gaps, which are suitable for microelectronic and optical devices such as highly sensitive IR photodetectors (1.55-30 μm). For example, the process of our invention can be used to make semiconductor structures comprising $Ge_{1-x}Sn_x$ alloys (x=0.02-0.15) that exhibit adjustable direct bandgaps between 0.7 eV and 0.4 eV, novel ordered structures with composition $Ge_5Sn_1$, strained direct gap Ge layers grown on $Sn_{1-x}Ge_x$ buffer layers, as well as related multilayer $Si/Ge_{1-x}Sn_x$/Ge heterostructures that are easy to manufacture and are predicted to exhibit intense absorption at 1.55 μm, the communication wavelength. The optical properties of these materials indicate that they can be used to fabricate new and efficient infrared photodetectors and sensors and related optical communication devices.

BRIEF DESCRIPTION OF THE DRAWINGS

The accompanying drawings, which are incorporated in and constitute a part of the specification, illustrate the presently preferred methods and embodiments of the invention. Together with the general description given above and the detailed description of the preferred methods and embodiments given below, they serve to explain the principles of the invention.

FIG. 1 shows Rutherford backscattering (RBS) aligned (gray line) and random (black line) spectra of two representative SnGe films (A: $Sn_{0.02}Ge_{0.98}$ and B: $Sn_{0.12}Ge_{0.88}$) grown on Si according to the present invention.

FIG. 2 is an electron micrograph showing the interface region of a representative SnGe film ($Sn_{0.02}Ge_{0.98}$) grown on Si according to the invention. The arrows point to Lomer defects at the interface accommodating the lattice mismatch between Si and SnGe.

FIG. 3 is a set of electron micrographs showing the entire film thickness (bottom) and the a magnified view of the surface (top) for another representative SnGe film ($Sn_{0.06}Ge_{0.94}$) grown on Si according to the invention. Note highly uniform film thickness with relatively few defects and atomically flat surface topology.

DESCRIPTION

Figure 4:
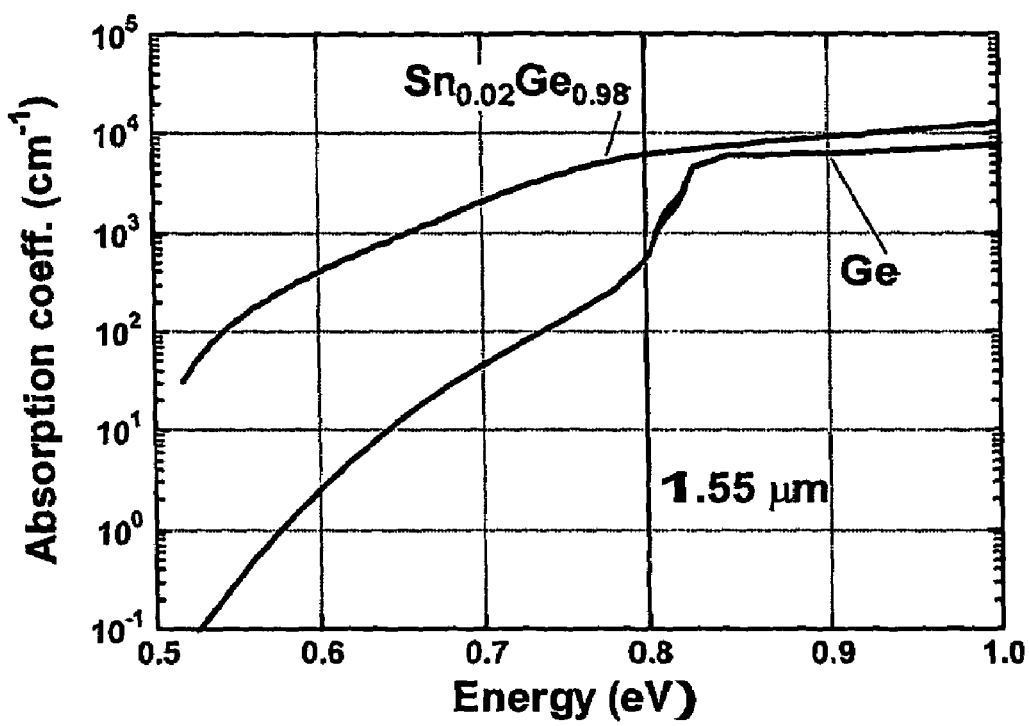
FIG. 4 is a graph of the absorption coefficients of bulk Ge and of $Sn_{0.02}Ge_{0.98}$ alloy grown on Si according to the invention. The graph shows the order-of-magnitude increase of energy absorption at the 1.55 μm wavelength resulting from the addition of a small concentration of Sn.

We have developed a novel chemical vapor deposition (CVD) process that permits device-quality single-crystal $Ge_{1-x}Sn_x$ alloys to be grown directly on Si. Using our novel process, we have achieved systematic growth and characterization of samples of strain free $Ge_{1-x}Sn_x$ alloys with concentrations of about 2-20 at. % Sn prepared directly on Si(100) substrates. The observed crystal properties are superior to those of pure Ge films grown on Si, indicating that Sn incorporation in tetrahedral Ge sites, even at modest concentrations, leads to superior structural and strain behavior compared to Ge, Si—Ge, and related systems. The high Sn content materials form superlattice structures that play a critical role in stabilizing Sn at substitutional sites in the Ge lattice. The process of the present invention invariably produces films with high uniformity that possess remarkably smooth surface morphologies (typical AFM rms values are 0.5 and 1.4 nm) and extremely low densities of threading defects, particularly for Sn concentrations between 2% and 6%. These results are remarkable, because the quality of pure Ge films of Si grown by similar methods is much worse.

Films grown according to our invention are also very intriguing, because $Sn_xGe_{1-x}$ alloys have previously been predicted to become direct-gap semiconductors for concentrations near x=0.2. See D. W. Jenkins and Y. D. Dow, Phys. Rev. B 36, 7994 (1987); K. A. Mader, A. Baldereschi, and H. von Kanel, Solid State Commun. 69, 1123 (1989). The optical properties of the films that we grew provide evidence for a well-defined, Ge-like band structure. Individual optical transitions can be easily identified and compared with those in pure Ge, and we find a systematic narrowing of the band gaps with increasing Sn concentration.

A key aspect of the process of our invention is the development of a low temperature pathway based on reactions of stabilized gaseous $SnD_4$, a simple and highly practical Sn source. CVD sources that are normally used in the synthesis of Si-based semiconductors are $SiH_4$ and $GeH_4$. However, the analogous $SnH_4$ molecule is unstable near room temperature due to the low Sn—H bond energy and is thus unsuitable for deposition applications. Since the substitution of deuterium for hydrogen should increase the kinetic stability of the molecules, we experimented with $(Ph)SnD_3$ and $SnD_4$ as possible sources for the growth of Sn-based semiconductors, as we described in M. Bauer, et al., Appl. Phys. Lett. 81, 2992 (2002), which is incorporated herein in its entirety by this reference. (Ph)SnD3 is a relatively stable Sn source, however, its low room temperature vapor pressure severely limits its application in growing high Sn concentration films. In the case of pure $SnD_4$, the enhanced stability provided by D is insufficient at 22° C., but we discovered that the combination of perdeuterated $SnD_4$ with high-purity $H_2$ (15-20% by volume) remains remarkably stable at 22° C. for extended time periods. This formulation represents the simplest possible source, and the preferred source, of Sn atoms for the growth of novel Sn—Ge systems of our invention.

According to one aspect of our invention, the growth of $Sn_xGe_{1-x}$ film proceeds at remarkably low temperatures, between 250° C. and 350° C., which makes it possible to grow thick films (50-1000 nm or higher) with Sn concentrations up to 20%. Since our films grow strain free there is in principle no upper limit in thickness and concentration that can be achieved.

The material is strain-free, with lattice parameters that are adjustable between 5.772 Å and 5.833 Å. The lattice mismatch between the $Sn_xGe_{1-x}$ layer and the Si substrate is accommodated by the formation of periodic Lomer edge dislocations which are parallel to the interface plane and do not degrade the crystallinity and properties of the film.

Method for Growing $Ge_{1-x}Sn_x$ Directly on Si

We conducted depositions of Ge—Sn materials on Si according to the method of our invention in a UHV-chemical vapor deposition reactor by reacting appropriate concentrations of $Ge_2H_6$ and $SnD_4$ on Si substrates at the remarkably low substrate temperatures between 250 and 350° C. and at $10^{-1}$-$10^{-3}$ Torr. For a typical synthesis, single-crystal Si (111) and Si (100) substrates are prepared for growth by a known modified RCA process, followed by hydrogen passivation of their surface. The modified RCA process is explained more fully in V. Atluri, N. Herbots, D. Dagel, H. Jacobsson, M. Johnson, R Carpio, and B. Fowler, Mater. Res. Soc. Symp. Proc. 477, 281 (1997), which is incorporated herein in its entirety by this reference. We used perdeuterated $SnD_4$ combined with high-purity $H_2$ (up to 15%-20% by volume) as the source of Sn. The reaction of $Ge_2H_6$ and $SnD_4$ on the Si substrates produced epitaxial $Ge_{1-x}Sn_x$ films.

The following examples help to further explain how we grew $Ge_{1-x}Sn_x$ films on Si using the method described above and demonstrate the high quality of the resulting films. It will be understood, however, that the examples are illustrative of the process and materials of the invention that the invention is not limited only to these examples.

EXAMPLE $Ge_{1-x}Sn_x$ (x=2-17%) on Si(100)

Using the method described above, we grew samples of epitaxial $Ge_{1-x}Sn_x$ films on Si(100) substrates at various temperatures between 250 and 350° C. Rutherford backscattering (RBS) revealed that thick layers (50-500 nm) with Sn contents of 13 to 17 at. % were deposited reproducibly between 300 and 280° C., respectively. Depositions at higher temperatures between 310 and 350° C. gave Sn contents of 12 to 2 at. %, respectively, indicating an inverse dependence of the growth temperature on Sn incorporation.

To determine the quality of epitaxial growth and evaluate the Sn substitutionality, RBS random and aligned spectra were recorded for the sample films. FIG. 1 shows typical (RBS) spectra for samples containing 2% and 12% Sn, demonstrating high quality Ge—Sn growth on Si(100). As shown in FIG. 1, both Sn and Ge channel remarkably well despite the large difference in lattice constant with the Si substrate. The channeling of Sn provides proof that this element must occupy substitutional tetrahedral sites. The extent of substitutionality can be assessed by comparing the values of $x_{min}$ between Ge and Sn in the same sample ($x_{min}$ is the ratio of the aligned versus random peak height). The value of $x_{min}$ is 4%, for both Ge and Sn in the $Ge_{0.98}Sn_{0.02}$ sample and 35% in the $Ge_{0.88}Sn_{0.12}$ sample, indicating that the entire Sn content is substitutional. The 4% value approaches the practical limit of about 3% for structurally perfect Si, which is unusual for a binary crystal grown directly on Si. The 35% value is relatively high and is likely due to some mosaic spread in the higher Sn-content crystal due to the increase in lattice mismatch. We are the first group to publish clear evidence for nearly perfect RBS channeling by the Sn and the Ge. This is a crucial experiment because it demonstrates the perfect Sn substitutionality in our samples Low-energy secondary ion mass spectrometry showed background levels of D, H, and C and revealed highly uniform Sn and Ge elemental profiles throughout the film. Homogeneity at the nanometer scale was confirmed using energy dispersive x-ray nanoanalysis in a high-resolution electron microscope with probe size less than 1 nm. Compositional profiles showed homogeneous Ge and Sn distribution with no evidence of phase separation or Sn precipitation.

We investigated the structural properties of sample films using cross-sectional electron microscopy (XTEM) and high-resolution x-ray diffraction. The XTEM studies revealed thick single-crystal layers with remarkably low concentrations of threading defects. FIG. 2 is a high-resolution cross-sectional electron micrograph of the interface region of a representative $Ge_{0.98}Sn_{0.02}$ grown on Si(100), which shows virtually perfect epitaxial growth, with arrows showing the location of misfit dislocations. FIG. 3 is a set of cross-sectional electron micrographs demonstrating high quality heteroepitaxial growth of a representative $Ge_{0.94}Sn_{0.06}$ grown on Si(100). The top panel of FIG. 3 shows atomically flat film surface morphology. The middle panel of FIG. 3 shows the exceptional uniformity of the film thickness. The bottom panel of FIG. 3 is a high-resolution electron micrograph of the interface region showing virtually perfect epitaxial growth, with arrows showing the location of misfit dislocations. The inset image of the bottom panel shows a selected-area diffraction pattern of the $Ge_{0.94}Sn_{0.06}$ film. Typical images in the (110) projection show occasional threading dislocations and {111} stacking faults sometimes extending through to the uppermost surface. The estimated density of these defects is less than $\sim10^7/cm^2$, a value well within the levels considered acceptable for device application. The predominant defects accommodating the large misfit are Lomer edge dislocations at the interface, which are parallel to the interface plane and should not degrade electrical properties and device performance. Finally, the film surface is virtually flat at the atomic level. The typical rms roughness of 0.5 to 1.4 nm, as observed by atomic force microscopy, is comparable to atomic step heights on Si surfaces.

X-ray measurements in the θ-2θ mode show a strong peak corresponding to the (004) reflection. In-plane rocking scans of the (004) reflection have a full width at half maximum between 0.25 and 0.50 degrees, indicating a tightly aligned spread of the crystal mosaics. The unit cell parameters obtained from the (004) reflection for samples containing 2, 3, 4, 9, 11, and 15 at. % Sn (as measured by RBS) were 5.6720, 5.6936, 5.7111, 5.7396, 5.7611, and 5.802 Å, respectively. These values are intermediate to those of Ge (5.658 Å) and α-Sn (6.493 Å), and they increase monotonically with increasing Sn concentration. Virtually identical values were obtained from the selected area electron diffraction patterns. Digital diffractogram analysis of TEM micrographs confirmed the measured values of the unit cell constants and also showed that the lattice parameter did not vary locally throughout the sample. High resolution off axis measurements and reciprocal space maps of the (004) and (224) reflections show that are materials are completely relaxed and free of local structural strains.

The Sn concentration as measured by RBS, the corresponding cell parameter estimated from Vegard's law, α(Vegard), and the experimental unit cell parameters α are listed in Table 1 set forth below. Also included are the results of theoretical calculations, based on ab initio density functional theory, for the lattice constants as a function of Sn. There is close agreement between theory and experiment. A striking feature is that a positive deviation from Vegard's law is found for both the experimental and theoretical values, which is in direct contrast with the compositional variation of the lattice constant in the classic $Si_{1-x}Ge_x$ and $Si_{1-x}C_x$ group IV alloys. In those systems the deviations from Vegard's law are usually negative, as described in Z. Charafi and N. Bouarissa, Phys. Lett. A 234, 493 (1997) and H. Kajiyamna, S-I. Muramatsu, T. Shimada, and Y. Nishino, Phys. Rev. B 45, 14005 (1992), which are incorporated herein by this reference.

TABLE 1

Observed and calculated lattice parameters. The observed lattice parameter composition dependence in the range 0%-15% Sn content is compared with Vegard's law. The calculated values are obtained from a first-principles local density approximation static lattice calculation. The "relaxed" results correspond to fully optimized structures.

| | Observed | | | Calculated | |
|---|---|---|---|---|---|
| % Sn | a(Vegard) | a(observed) | Sn/Ge | a(Vegard) | a(relaxed) |
| 0 | 5.658 | 5.658 | 0 | 5.626 | 5.626 |
| 2 | 5.675 | 5.672 | 1/64 | 5.639 | 5.639 |
| 3 | 5.683 | 5.694 | 2/64 | 5.652 | 5.653 |
| 4 | 5.691 | 5.711 | 4/64 | 5.678 | 5.683 |
| 9 | 5.733 | 5.740 | 8/64 | 5.729 | 5.737 |
| 11 | 5.750 | 5.761 | 12/64 | 5.781 | 5.792 |
| 15 | 5.783 | 5.802 | 1 | 6.456 | 6.456 |

In order to further characterize the local bonding environment in the Ge—Sn lattice, the Raman spectrum of each sample was acquired. The materials showed a strong peak corresponding to Ge—Ge phonon mode, which is down-shifted substantially with respect to pure Ge. The vibrational frequencies decrease monotonically with increasing Sn concentration due to the combined effects of mass substitution and elongation of the average Ge—Ge bond distances. The compositional dependence of the Ge—Ge frequency shift can be fitted with an expression of the form $\Delta\omega(x)=-72x$ (in $cm^{-1}$) where x is the Sn concentration. This dependence agrees well with an extrapolation of similar results for strain-free $Si_{1-x}Ge_x$ and $Si_{1-x}C_x$ alloys based on a simple model for the compositional dependence of Raman modes in alloy semiconductors, described by J. Menendez, in *Raman Scattering in Materials Science*, edited by W. H. Weber and R. Merlin (Springer, Berlin, 2000), pp. 55-103.

The Ge—Sn samples were annealed between 400 and 750° C. to determine their thermal stability. The x-ray lattice parameter and the $x_{min}$ values of the RBS signals were measured and compared with the pre-annealed values, and XTEM and nanoprobe energy dispersive x-ray analysis were used to determine phase separation and any elemental inhomogeneity. Samples with composition $Ge_{0.98}Sn_{0.02}$ were remarkably stable up to at least 750° C. and showed an improvement in crystallinity with increasing temperature. The $Ge_{0.95}Sn_{0.05}$ composition remained robust up to 600° C., but displayed substantial Sn precipitation between 600-700° C. In the case of the $Ge_{0.88}Sn_{0.12}$ and $Ge_{0.85}Sn_{0.15}$ compositions, the corresponding thermal stability range was reduced to below ~500 and ~450° C., respectively.

Example

Growth of $Ge_{1-x}Sn_x$ (x=17-20%) on Si(100) and Si(111)

Using the process of our invention, we conducted further materials synthesis by reacting appropriate concentrations of $Ge_2H_6$ and $SnD_4$ on single crystal Si(111) and Si(100) substrates at a temperature of ~250° C.-280° C. The aim was to increase the Sn content beyond 15 at. % and to explore growth on Si(111) substrates. For a typical synthesis, the substrates were prepared for growth by the modified RCA process described above, followed by hydrogen passivation of their surface. The reactions of $Ge_2H_6$ and $SnD_4$ on the pure Si template produced thick films (70-200 nm) with Sn concentrations of 17-20 at. %, as measured by Rutherford backscattering (RBS). The RBS random and aligned spectra were also recorded and compared. The ratio between the aligned and random peak heights, which measures the degree of channeling of the $He^{2+}$ ions, was identical for both Ge and Sn, indicating unequivocally that that the entire Sn content occupies substitutional sites in the average diamond cubic structure. High-resolution X-ray diffraction indicated single-phase crystalline films in epitaxial alignment with the Si substrate, with no evidence of significant tetragonal distortion. The unit cell parameters obtained from the diffraction data for samples with 18 and 20 at. % Sn were 5.82 Å and 5.84 Å respectively. For the Si (111) sample, in-plane rocking scans of the (004) reflection have a full-width-at-half-maximum of 0.07° C. indicating highly aligned crystal mosaics. Low-energy secondary ion mass spectrometry confirmed highly uniform Sn and Ge elemental profiles throughout the film and revealed the absence of D and H impurities.

Optical Properties of $Sn_xGe_{1-x}$ Films

We studied the optical properties of sample $Sn_xGe_{1-x}$ films grown on Si substrates according to our invention with spectroscopic ellipsometry, which yields the complex pseudo-dielectric function $(\delta_1 + \epsilon_2)$ and the film thickness. Ellipsometric measurements are particularly challenging in $Sn_xGe_{1-x}$ alloys due to the expected existence of optical transitions from the mid-infrared to the ultraviolet. We used a combination of two instruments. A VASE® variable angle spectroscopic ellipsometer (available from J.A. Woollam and Co. of Lincoln, Nebr.) covered the 0.5 eV-4.1 eV range. This instrument is equipped with a Xenon lamp, a double monochromator, and am extended infrared InGaAs detector. An IR-VASE® ellipsometer (also available from J.A. Woollam and Co.) was used to cover the 0.03 eV-0.83 eV range. This ellipsometer is based on a Fourier-transform spectrometer. The optical constants for our films were obtained by modeling our samples as three-layer systems comprising a surface layer, the $Sn_xGe_{1-x}$ film, and the Si substrate. Numerical derivatives of the dielectric function were computed and compared with analytical models of the dielectric function near critical points in the electronic density of states.

FIG. 4 is a graph of the absorption coefficients of bulk Ge and of a $Sn_{0.02}Ge_{0.98}$ alloy grown on Si according to our invention. The absorption coefficients of the $Sn_{0.02}Ge_{0.98}$ alloy were obtained from the ellipsometry data. As shown in FIG. 4, the addition of a very small Sn concentration increases by an order of magnitude the absorption coefficient at the 1.55 μm wavelength. Because this wavelength is typically used for fiber optic communications, this demonstrates the potential of $Sn_xGe_{1-x}$ alloy for use in high-efficiency infrared detectors.

Figure 5:
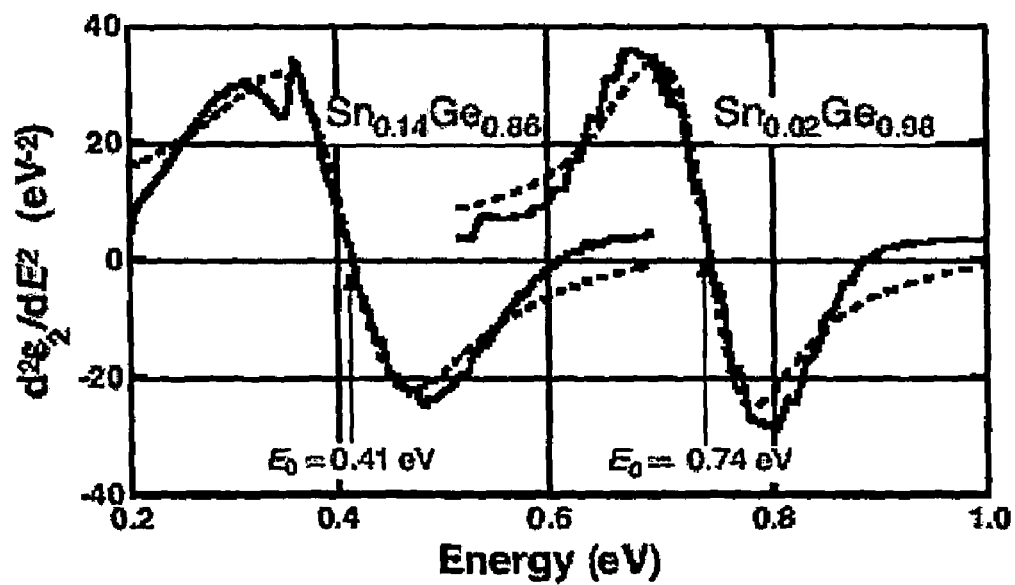
FIG. 5 is a graph of the second derivative of the dielectric function from ellipsometric measurements showing the direct band gap $E_0$ for $Sn_{0.02}Ge_{0.98}$ and $Sn_{0.14}Ge_{0.86}$ alloys grown on Si according to the invention. The direct bandgap for $Sn_{0.02}Ge_{0.98}$ and $Sn_{0.14}Ge_{0.86}$ are 0.74 eV and 0.41 eV respectively, compared to 0.81 eV for Ge

By computing derivatives of the optical constants as a function of the photon energy, we determined the energies of critical points in the electronic band structure as well as the direct band gap $E_0$, FIG. 5 shows the second derivative of the imaginary part of the dielectric function for two samples of $Sn_xGe_{1-x}$ films (where x=0.02 and 0.14) grown according to the invention. The sharp feature shown in FIG. 5 is associated with the direct band gap $E_0$, which can be determined with a precision of 10 meV. As shown in FIG. 5, the direct bandgap for $Sn_{0.02}Ge_{0.98}$ is $E_0$=0.74 eV and the direct bandgap for $Sn_{0.14}Ge_{0.86}$ is $E_0$=0.41 eV. Comparing this with $E_0$=0.81 eV for Ge, we find a dramatic band gap reduction of 50% for only 14% Sn.

Figure 6:
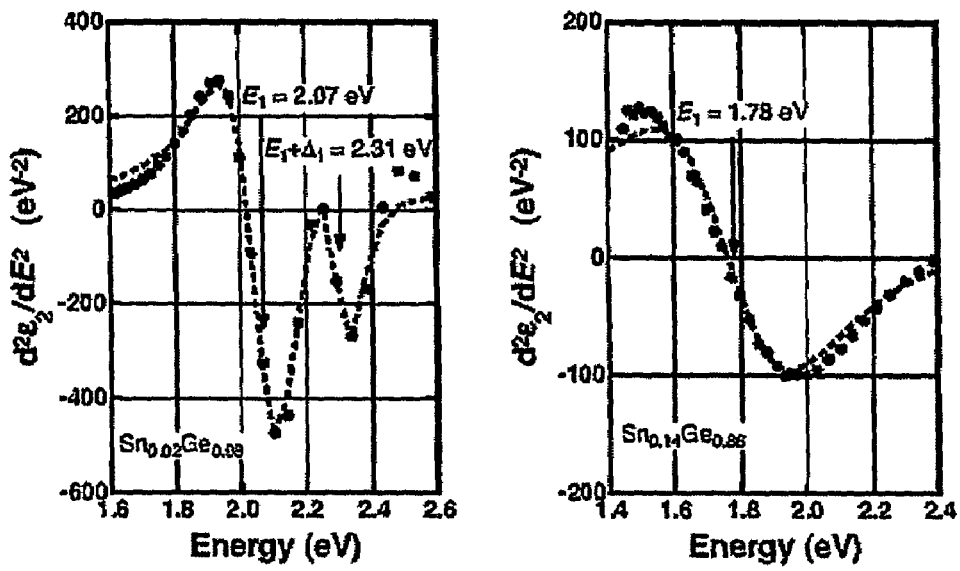
FIG. 6 shows the numerical second derivative of the imaginary part of the dielectric function near the $E_1/E_1+\Delta_1$ transitions for two $Sn_xGe_{1-x}$ films. The dashed lines show theoretical fits. The $E_1$ for $Sn_{0.02}Ge_{0.98}$ and $Sn_{0.14}Ge_{0.86}$ are 2.07 eV and 1.78 eV respectively, compared to 2.12 eV for Ge.

FIG. 6 shows the second derivative of the imaginary part of the dielectric function near the $E_1$ transition for $Sn_{0.02}Ge_{0.98}$ and $Sn_{0.14}Ge_{0.86}$ alloys grown on Si according to the invention. As shown in FIG. 6, $E_1$ for $Sn_{0.02}Ge_{0.98}$ and $Sn_{0.14}Ge_{0.86}$ are 2.07 eV and 1.78 eV, respectively. FIG. 6 shows ellipsometric results near the $E_1$ and $E_1+\Delta_1$ transitions between the highest valence bands and the lowest conduction band at the L-point of the fcc Brillouin zone. The shape of the curve is very similar to that obtained for pure We, confirming the high quality of our films. From these data one can also determine the relevant optical transitions with high accuracy.

We also performed Raman resonance scattering experiments to show qualitatively the reduction in band gap with increasing Sn content in selected samples. The Raman cross-section in pure Ge undergoes a resonant enhancement for laser photon energies near the $E_1$ and $E_1+\Delta_1$ gaps, as described by F. Cerdeira, W. Dreyrodt, and M. Cardona, Solid State Commun. 10, 591 (1972). We performed similar measurements for a $Ge_{0.95}Sn_{0.05}$ alloy and a Ge reference. The net result was a redshift of $E_1$ and $E_1+\Delta_1$ by about 100 meV relative to pure Ge.

We performed IR transmission measurements for several Ge—Sn samples in the range of 2000 and 10,500 $cm^{-1}$. While the exact location of the absorption edges was not determined, our results clearly demostrate that between 4000 and 8000 $cm^{-1}$ the absorption coefficient increases monotonically by a substantial amount with increasing Sn content. The most plausible explanation is a decrease of the band gap as a function of composition, since such a reduction is likely to result in increased absorption at a fixed photon energy above the bandgap.

Figure 7:
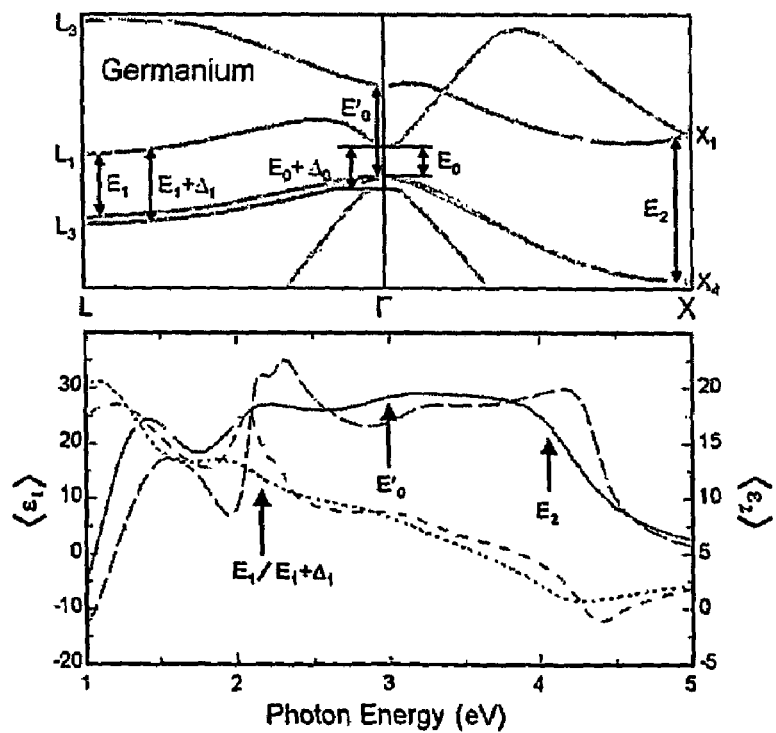
FIG. 7 is a pair of graphs showing (in the top graph) Ge band structure defining the position of important bandgaps related to critical point in the ellipsometry measurements and (in the bottom graph) real ($\in_1$) and imaginary ($\in_2$) parts of pseudodielectric function for $Ge_{1-x}Sn_x$, x=0.16 (real part—solid line, imaginary part—dotted line) grown on Si (111).
Figure 8:
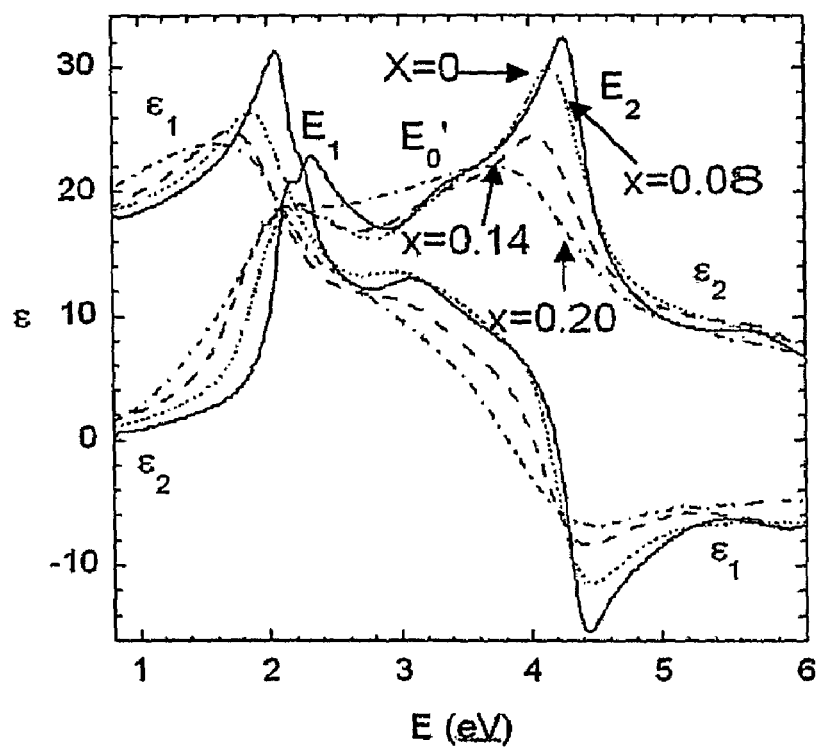
FIG. 8 shows complex dielectric function of $Ge_{1-x}Sn_x$ alloys at x=0.08 (dotted), x=0.14 (dashed), and x=0.20 (dot-dashed) in comparison with bulk Ge (solid) indicating a monotonic reduction in critical point energies with increasing Sn content.

We also used UV spectroscopic, ellipsometry in the 1 to 6 eV photon energy range to investigate the band structure of $Ge_xSn_{1-x}$, with x=0-0.2. Again, for x=0, a bulk Ge crystal was used as the reference point. Referring to FIG. 7, the top graph shows a Ge-like band structure defining the position of important bandgaps related to the critical point measurements by ellipsometry. The bottom graph of FIG. 7 shows real $(\in_1)$ and imaginary $(\in_2)$ parts of pseudodielectric function for $Ge_{1-x}Sn_x$, x=0.16 (real part—solid line, imaginary part—dotted line) grown on Si (111) showing the strong qualitative similarity with the corresponding behavior of pure Ge (real part—dashed line, imaginary part—fine dashed line). Three structures at 2.1 eV, 2.9 eV, and 4.2 eV correspond to the $E_1/E_1+\Delta_1$, $E_0'$, and $E_2$ critical points. The features seen below 1.9 eV are interference fringes. Referring to FIG. 7 (bottom), a close examination of the imaginary part $(\in_2$ of the pseudodielectric function for the $Ge_{0.84}Sn_{0.16}$ sample shows a peak between 2.00 and 2.20 eV corresponding to the $E_1$ and $E_1+\Delta_1$ transitions. For the higher concentration samples (x>0.16), the $E_1$ and $E_1+\Delta_1$ transition peaks broaden significantly, resulting in only one distinguishable peak for the two transitions. A shoulder at 2.90 eV is assigned to the $E_0'$ critical point and a feature near 4.20 eV corresponds to the $E_2$ energy gap. We are able to obtain an accurate determination of these critical points using a derivative analysis showing their corresponding band gaps in Table 2. The critical point data indicate a systematic narrowing of the band gaps with increasing Sn concentration as shown by (also shown in FIG. 8)

TABLE 2

Critical point energy values for $Ge_{1-x}Sn_x$. For x = 0.02 and 0.20, the samples were grown on Si (111).

| x | $E_1$ (eV) | $E_1+\Delta_1$ (eV) | $E_0'$ (eV) | $E_2$ (eV) |
|---|---|---|---|---|
| 0.00 | 2.11 | 2.31 | 3.12 | 4.36 |
| 0.02 | 2.03 | 2.24 | 3.06 | 4.32 |
| 0.08 | 1.99 | 2.16 | 3.07 | 4.27 |
| 0.16 | | 2.09 | 2.94 | 4.16 |
| 0.18 | | 2.01 | 3.01 | 4.17 |
| 0.20 | | 1.99 | 2.95 | 4.12 |

Figure 9:
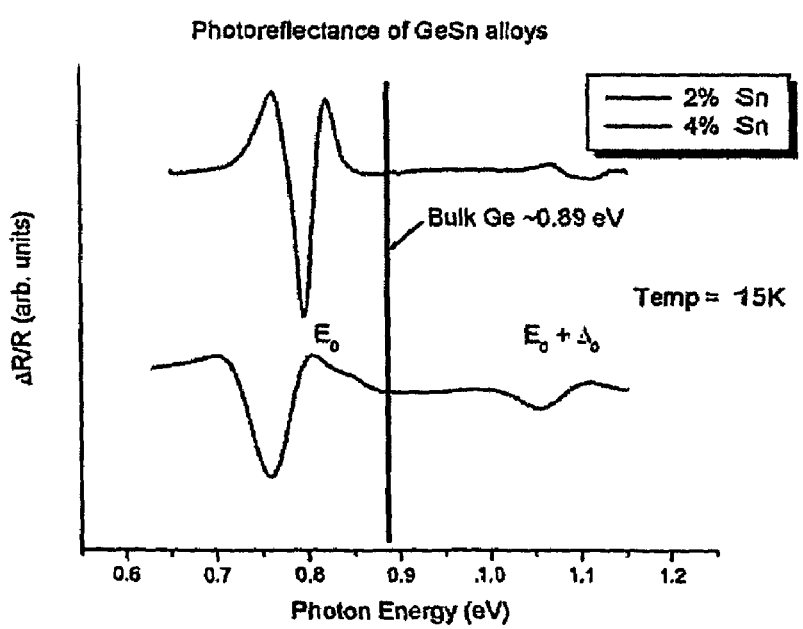
FIG. 9 depicts photoreflectance spectra (at 15K) of $Ge_{1-x}Sn_x$ showing a red shift of the direct bandgap $E_o$ for samples with 2% Sn (top trace) and 4% Sn (bottom trace) relative to that of pure Ge (vertical line)

Our results for the $E_0$ as well as the $E_1$ and $E_1+\Delta_1$ transitions show very large deviations from a simple linear interpolation of transition energies between Ge and α-Sn. Thus the determination of the compositional dependence of the band structure on Sn concentration is important for the design of devices based on $Sn_xGe_{1-x}$. We obtained additional data by photoreflectance for selected samples incorporating 2 and 4% Sn. We were able to obtain accurate values for the direct band gap $E_0$ which showed a definite decrease of the band gap energy with increasing Sn concentration. FIG. 9 compares the photoreflectance spectra of the $Sn_{0.02}Ge_{0.98}$ and $Sn_{0.02}Ge_{0.96}$ samples with that of pure Ge. The data were obtained at 15 K and are consistent with those obtained with IR ellipsometry.

Collectively, the data in FIGS. 4-9 indicate that Sn incorporation into Ge lattice sites decreases the bandgap and critical point energies and dramatically increases the sensitivity of this system to infrared radiation. Thus, the new alloys according to our invention are excellent candidates for a new generation of IR photodetectors, with the important additional benefit that they can be grown on inexpensive Si substrates. Since films grown according to our invention grow essentially strain-free, there is in principle no upper limit to the Sn concentration that can be achieved. Thus, our approach represents the most straightforward route to direct-gap $Sn_xGe_{1-x}$ alloys and a practical solution to the long-standing problem of growing direct-gap semiconductors on Si. The very large lattice mismatch between films grown according to our invention and the Si substrate opens up intriguing new opportunities for band gap and strain engineering on silicon.

Ordered Phases with Composition $Ge_{4-5}Sn$

We explored the microstructural properties of $Sn_xGe_{1-x}$ films of our invention by transmission electron microscopy (TEM) and conducted investigations of structure vs. composition to search for novel ordered phases that are likely to have unique and exciting properties, such as high electron mobilities and direct band gaps. We have discovered that the compositional range of about $Sn_{0.16-0.20}Ge_{0.83-0.80}$ displays an unusual ordering of the atoms in the structure.

We grew samples of thin epitaxial films of $Sn_{0.16-0.20}Ge_{0.83-0.80}$ materials on Si(100) and Si(111) substrates using the method described above. We characterized these samples by RBS, x-diffraction and high-resolution electron microscopy, including extensive Z-contrast and electron energy loss spectroscopy (EELS) analyses at 1.7 Å resolution. The structural investigations indicate the existence of a superstructure that has a periodicity along the <111> direction that is three times larger than that of the underlying substrate. As discussed more fully below, experimental and theoretical data suggest novel phases in which the Ge and Sn atoms are aligned in the sequences of Ge—Ge—$Sn_{0.50}Ge_{0.50}$ and Ge—$Sn_{0.25}Ge_{0.75}$—$Sn_{0.25}Ge_{0.75}$ along the diamond <111> direction. The theoretical studies provide structural models that are consistent with the composition as well as the spectroscopic, microscopic and diffraction data of this material.

Figure 10:
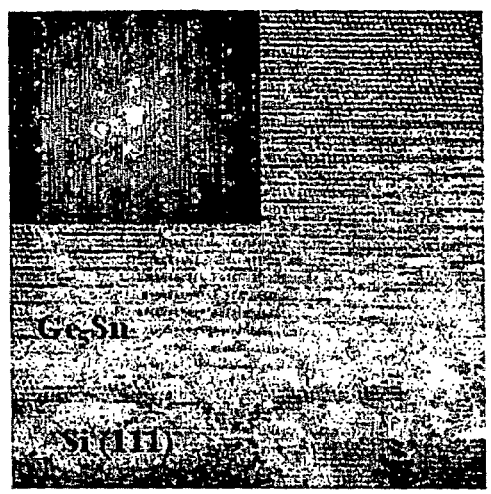
FIG. 10 is an XTEM micrograph of a $Ge_5Sn$ sample demonstrating that an ordered phase forms adjacent to the Si(111) interface throughout the layer. The inset image is the diffraction pattern of the entire layer and the Si substrate, which shows a clear set of superlattice spots corresponding to the ordering along the (111) direction.

We conducted energy dispersive X-ray spectroscopy on a Philips CM200 TEM with a nanometer sized electron probe, which showed that the constituent elements Sn and Ge appeared together at every nanometer scale region probed without any segregation of the individual elements. FIG. 10 is a high-resolution phase contrast image of a $Ge_5Sn_1$ sample demonstrating that the ordered alloy forms directly adjacent to the Si(111) interface. Diffraction pattern (inset) of the entire layer and the Si substrate shows a clear set of superlattice spots corresponding to the ordering along the (111) direction. High-resolution phase contrast imaging of the high Sn content materials show that much of the film was dominated by a superlattice structure. Within these regions, the periodicity was tripled along the (111) direction of the underlying Si lattice. The presence of the superlattice was confirmed by single crystal selected area electron diffraction (see FIG. 10 inset). Electron diffraction analysis of the phase contrast images for the 20 at. % Sn sample deposited on (111) Si gave a lattice constant of the parent diamond structure of 5.839 Å, which is close to the value determined by X-ray diffraction (5.837 Å). The lattice parameter of the disordered phase, determined by digital diffractogram analysis of the high-resolution images, is virtually identical to that of the ordered structure indicating that the Sn concentration is uniform throughout the ordered and disordered areas of the film. Both the ordered and disordered layers showed complete heteroepitaxy with the underlying Si substrate.

Figure 11:
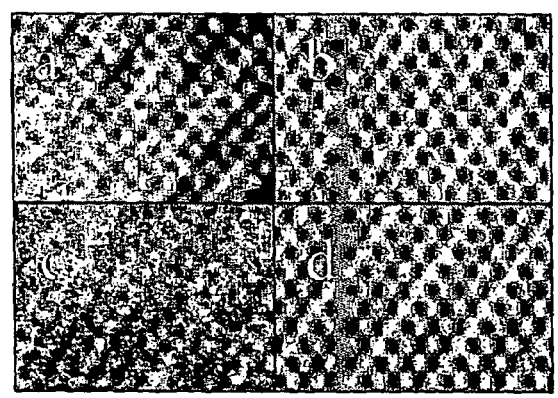
FIG. 11 shows experimental and simulated Z-contrast images of random and ordered $Ge_5Sn$ alloys according to the invention. Frames (a) and (b) show experimental and simulated images, respectively, from a double banded structure. Frames (c) and (d) show experimental and simulated images, respectively, from a single-banded structure.

The fraction of the ordered phase increased with increasing Sn content, reaching approximately 60% for the 20 at. % Sn sample deposited on Si (111). The co-existence of the random and ordered alloys will cause a splitting of the critical points in the optical data, which contributes to the observed peak broadening of FIG. 7. High-resolution Z-contrast imaging performed on a JEOL 2010F revealed the presence of two distinct atomic arrangements in the ordered alloy. Frames (a) and (c) of FIG. 11 show experimental Z-contrast images of random and ordered SnGe alloys according to the invention, with the frame width being 5 nm. Z-contrast imaging is explained in more detail by M. M. McGibbon, N. D. Browning, M. F. Chisholm, A. J. McGibbon, S. J. Pennycook, V. Ravikumar, V. P. Dravid, *Science* 266, 102 (1994), which is incorporated herein by this reference. In Z-contrast images, for thin samples, the intensity depends directly on the average atomic number Z of the atomic column under observation. Thus, atomic columns containing Sn appear considerably brighter than columns of pure Ge. Frame (a) of FIG. 11 is the most commonly found superstructure showing a double banded contrast consisting of periodic sequences of two Sn-rich layers with bright contrast followed by a single Ge-rich layer of dark contrast along the <111> direction. Frame (c) of FIG. 11 is a less common single banded form showing two Ge-rich layers for every Sn-rich bright layer.

Figure 12:
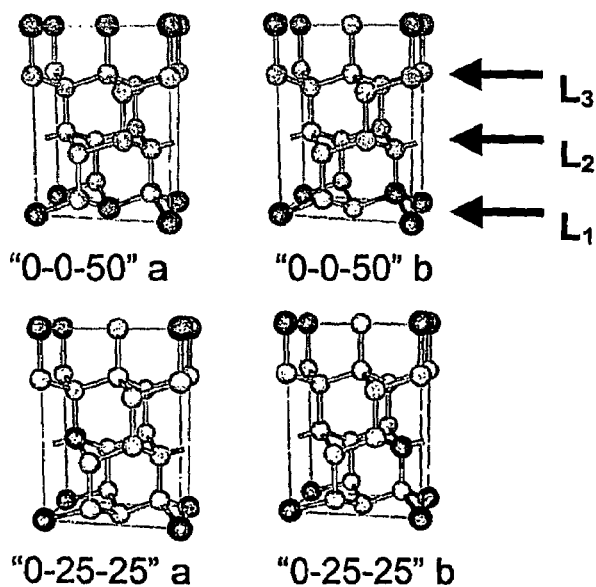
FIG. 12 depicts the models of the layered $Ge_5Sn$ alloys consistent with the Z-contrast atomic resolution microscopy.

For a general discussion of ordering in semiconductors, see P. Mock, T. Topuria, N. D. Browning, G. R. Booker, N. J. Mason, R. J. Nicholas, M. Dobrowolska, S. Lee, and J. K. Furdyna, Appl. Phys. Lett. 79, 946 (2001) and by A. Zunger and S. Mahajan, in *Handbook on Semiconductors*, edited by S. Mahajan (North Holland, Amsterdam, 1994), Vol. 3, Chap. 9, p. 1399, which are incorporated herein by this reference. In our case, the ordering described above was predominantly observed in samples with an average Sn concentration close to 16-20 at. %. Thus, we constructed models of superstructures with composition $Ge_5Sn_1$. The structural models are shown in FIG. 12. They have orthorhombic unit cells derived from the zincblende lattice and contain three distinct layers (labeled $L_1$, $L_2$ and $L_3$)) each of which contains four possible lattice sites. The long axis of the orthorhombic cells is topotactic with the [111] direction in the original diamond lattice. The top two models, denoted by "0-0-50", represent the extreme Sn-rich scenario in which half of the sites within the $L_1$ layer are occupied by Sn. The bottom two "0-25-25" models of FIG. 12 have their Sn concentration distributed between both the $L_1$ and $L_2$ layers. A 50% occupancy of Sn atoms within the $L_1$ layer yields the "0-0-50" model which is characterized by a single Sn-rich layer alternating between two Sn-depleted layers. There are two unique ways of distributing the Sn atoms in the $L_1$ layer giving two models labeled 0-0-

50a and 0-0-50b. Distributing the Sn atoms on 25% of the sites within the $L_1$ and $L_2$ layers, with Ge exclusively occupying the $L_3$ layer yields the "0-25-25" model. Similarly there are two unique ways of distributing the Sn atoms among the $L_1$ and $L_2$ layers. All models except 0-0-50b incorporate exclusively heteropolar Ge—Sn bonds and avoid higher energy first neighbor tin-tin interactions. We also constructed a series of random alloy (RA) structures by doubling the supercell along the orthorhombic b-axis to yield a 24-atom cell, and then randomly distributing four Sn atoms among the available sites.

These model structures were studied using first principles quantum mechanical calculations based on density functional theory (DFT) and the local density approximation (LDA) for exchange and correlation, (explained in more detail by D. M. Ceperley, B. J. Alder, *Phys. Rev. Lett.* 45, 566 (1980)) as implemented in the VASP program described by T G. Kresse and J. Hafner, *Phys. Rev.* B47, R558 (1993); G. Kresse and J. Hafner, *Phys. Rev.* B49, 14251 (1994); and G. Kresse, J. Furthmuller, *Comput. Mater. Sci.* 6, 15 (1996); G. Kresse, J. Furthmuller, *Phys. Rev.* B54, 11169 (1996). The shape and volume of the supercells were optimized while fully relaxing all internal atomic coordinates to an accuracy of 0.001 eV/Å. All results were obtained using the ultrasoft norm-conserving Ge and Sn pseudopotentials supplied with the VASP package. Converged results were obtained using a plane-wave basis set cutoff of 600 eV for all calculations. A 3×6×3 Monkhorst-Pack grid was used to generate 27 irreducible k-point in the orthorhombic 12-atom setting, while the same procedure generated 10 irreducible k-point for the expanded cells used for the random alloy simulations. For the random alloy, we carried out calculations on 5 of the random Sn configurations and averaged the unit cell parameters, which exhibited length and angle variances of ~0.02 Å and 0.05 degrees, respectively. The ground state structures and energies of the five alloy structures are listed and compared in Table 3. While the 0-25-25b model is predicted to possess the lowest energy, random alloys are found to be only slightly less energetically favorable. This is consistent with the experimental finding that the majority of the material is ordered in the 20 at. % Sn sample grown on the Si (111) surface. Using the predicted structures obtained from the modeling, we simulated the Z-contrast images for the two order phases using the multi-slice codes developed by E. J. Kirkland, *Advanced Computing in Electron Microscopy*, Plenum Press, New York, (1998). The simulated images are shown in frames (b) and (d) of FIG. 11 and suggest that our models are in good agreement with the experimental measurements.

Strained Ge Grown on $Sn_xGe_{1-x}$ Buffer Layers

Figure 13:
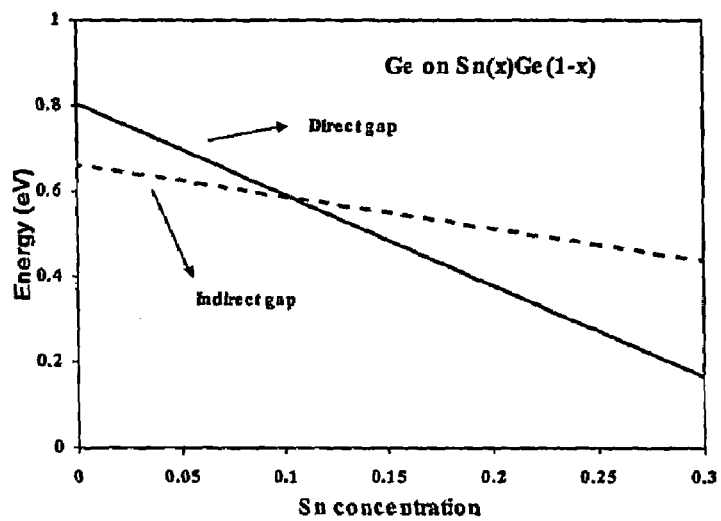
FIG. 13 shows the predicted band gaps of tensile-strained Ge as a function of the Sn concentration in the $Sn_xGe_{1-x}$ buffer layer.

According to another aspect of our invention, we also have grown nearly defect-free Ge films on $Sn_xGe_{1-x}$ buffer layers grown on Si substrates according to the process described above. FIG. 13 shows a calculation of the direct and indirect edges of Ge strained to lattice-match a $Sn_xGe_{1-x}$ buffer layer as a function of the Sn concentration in the $Sn_xGe_{1-x}$ buffer layer. The calculation is based on deformation potential theory, and it shows a very interesting feature: strained Ge becomes a direct gap material if the Sn concentration in the buffer layer exceeds 11%. Soref and Friedman theorized this almost 10 years ago and proposed several heterostructures for p-i-n injection lasers. See R. A. Soref and L. Friedman, Superlattices and Microstructures 14, 189 (1993). Yet, until now there has not been a commercial viable method to produce such materials or to confirm the theory.

Figure 14:
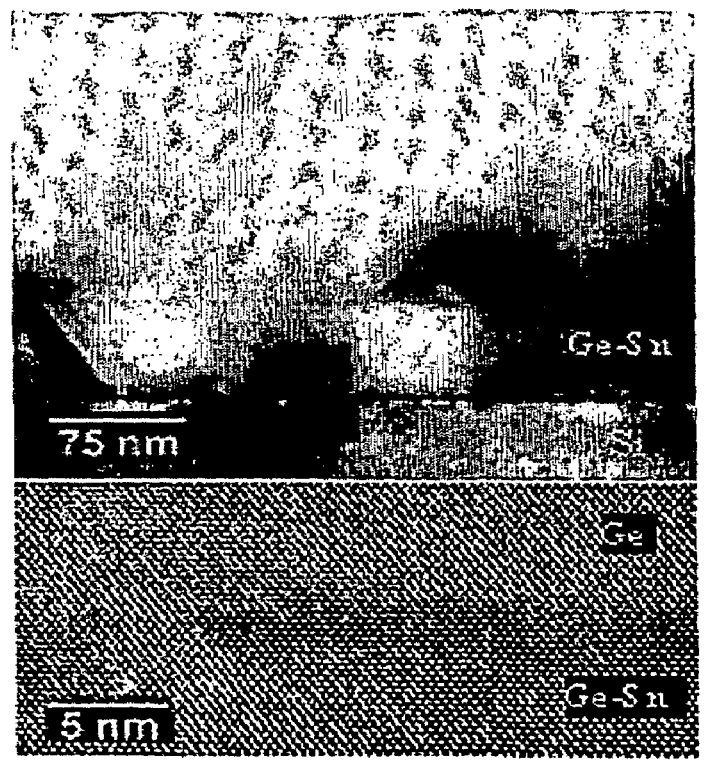
FIG. 14 is an XTEM micrograph of the entire Si/Sn—Ge/Ge heterostructure thickness (top panel) showing virtually no defects terminating at the top surface. The magnified view of the interface (bottom panel) shows perfect heteroepitaxy between SnGe and Ge. Plan view TEM analysis indicates (not shown) that the defects are mainly concentrated at the Ge—Sn buffer layer.

A complete characterization of the strain properties of the Ge films that we grew indicates that the Ge films are tensile strained as expected for a material grown on a surface that possesses a larger lattice dimension. In a typical experiment, a $Sn_xGe_{1-x}$ buffer layer having a thickness of about 20-200 nm is grown by reaction of the appropriate combinations of $SnD_4$ and $Ge_2H_6$ according to the process described above. The Ge overlayers are then deposited at 400-450° C. by thermally activated dehydrogenation of $Ge_2H_6$ on the Ge—Sn buffer layers. Cross-sectional electron micrographs of the resulting system show completely epitaxial Ge grown on $Ge_{0.97}Sn_{0.03}$ FIG. 14 is an XTEM micrograph of the entire Si/Sn—Ge/Ge heterostructure thickness. As can be seen, the Ge layer is free of stacking and threading defects. Virtually all of the defects are concentrated at the Ge—Sn buffer layer, and the Ge overlayer in the upper portion of the heterostructure remains virtually defect-free.

GeSn Nanostructures Grown on Silicon

The successful synthesis of Sn—Ge epitaxial films on Si described above prompted us to undertake the growth of related nanostructures such as alloy quantum dots and three-dimensional islands to further explore tailoring the optical properties of this novel system. Ge—Sn nanostructures with direct tunable bandgaps combined with the underlying Si substrate (which is indispensable for viable device development) should have tremendous potential for use in infrared laser technologies.

In accordance with another aspect of the invention, therefore, we have developed a new family of semiconductor quantum dots (QDs) with tunable direct bandgaps in the infrared spectral region for Si-based bandgap and lattice engineering applications. We have created closely related nanoscale archi-

TABLE 3

Ground state structural parameters of the orthorhombic cell and energies for the superstructures ("0-0-50", "0-25-25") and the random alloy ("RA") models of $Ge_5Sn_1$. Lengths are given in Å, energies in eV and relative energies in meV/atom.

|  | a | b | c | α | β | γ | E (eV) | ΔE/atom (meV) |
|---|---|---|---|---|---|---|---|---|
| "0-0-50"b | 7.091 | 4.057 | 10.025 | 90.0 | 90.1 | 90.0 | −60.39283 | 21.8 |
| "0-0-50"a | 7.081 | 4.067 | 10.030 | 90.0 | 90.1 | 90.0 | −60.55231 | 8.5 |
| "RA" | 7.059 | 4.089 | 9.957 | 90.0 | 89.8 | 90.0 | −60.63324 | 1.8 |
| "0-25-25"a | 7.093 | 4.064 | 9.996 | 90.0 | 90.2 | 90.0 | −60.64655 | 0.7 |
| "0-25-25"b | 7.090 | 4.065 | 9.993 | 90.0 | 90.1 | 90.0 | −60.65462 | 0 | tectures with unusual morphologies and nearly perfect crystallinities via new methods combing specially designed molecular sources and novel deposition techniques involving in situ observation and control of the growth process by LEEM and UHV-SEM-MBE.

Figure 15:
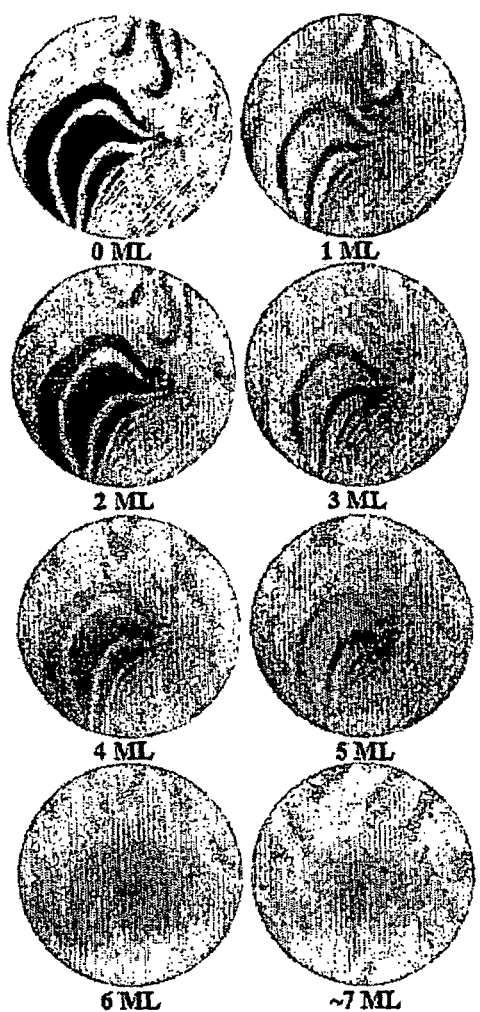
FIG. 15 is a sequence of LEEM frame-captured images from an 8-μm diameter area of GeSn growth showing layer-by-layer growth. The thickness of the GeSn epitaxial layer is indicated below each image.

A survey of preliminary experiments of quantum dot growth was conducted in a molecular beam epitaxy chamber equipped with a low energy electron microscope (LEEM), allowing the entire growth process to be observed and controlled in situ and in real time. The precursor gases ($Ge_2H_6$ and $SnD_4$) were adjusted in the reaction mixture so as to incorporate Sn concentration of about 2-3 at. % in the alloy. FIG. 15 shows a sequence of LEEM images from an 8-µm diameter area of GeSn growth at 350° C. The terraces, which are separated by single-height atomic steps, alternate from dark to bright contrast due to the rotation of the dimer reconstruction on the terraces, as shown in the first image in FIG. 15. As the GeSn film was deposited on the Si(100) substrate, the contrast of each terrace changed from dark to bright or from bright to dark respectively. The contrast alternation indicates that the growth mode is layer-by-layer. The LEEM results reveal that at least for the first six monolayers, the $Ge_{1-x}Sn_x$ deposition takes place by the layer-by-layer growth mode. However, the contrast faded away permanently as the coverage exceeded 6 ML, indicating transition to a three-dimensional island-like growth mechanism. Continued deposition generated the desired assemblies of $Ge_{1-x}Sn_x$ quantum dots. The average Ge and Sn concentration was determined by RBS to be $Ge_{0.97}Sn_{0.03}$. Atomic force microscopy (AFM) indicated the presence of three-dimensional faceted islands dispersed on the surface of the substrate. XTEM revealed that the material consisted of a continuous and completely epitaxial wetting layer, followed by an array of nanoscale bump-shaped islands randomly distributed on the surface of the underlying layer. The presence of the wetting layer is consistent with the LEEM observations of two-dimensional layer-by-layer growth for the first six monolayers.

Figure 16:
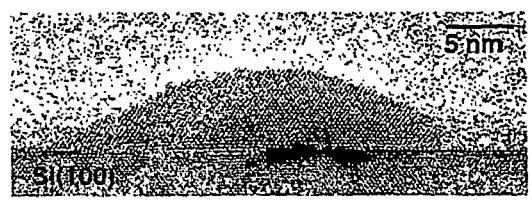
FIG. 16 is an XTEM image of a $Ge_{1-x}Sn_x$ (x=0.03) island on Si(100), showing a small quantum dot exhibiting highly coherent epitaxial and defect-free character. The micrograph illustrates the relationship between size and quality of epitaxial growth.
Figure 17:
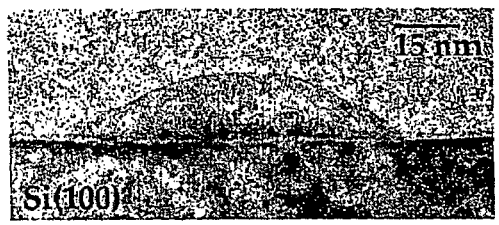
FIG. 17 is an XTEM image of another $Ge_{1-x}Sn_x$ (x=0.03) island grown on Si(100) showing a larger island in which strain is relieved via formation of (111) stacking faults.

FIG. 16 is an XTEM image of a $Ge_{1-x}Sn_x$ (x=0.03) island on Si(100), showing a small quantum dot exhibiting highly coherent epitaxial and defect-free character. The micrograph illustrates the relationship between size and quality of epitaxial growth. FIG. 17 is an XTEM image of another $Ge_{1-x}Sn_x$ (x=0.03) island on Si(100), showing a larger island in which strain is relieved via formation of (111) stacking faults. The smaller island shown in FIG. 16 is highly strained and completely coherent and defect free despite the large mismatch of the Ge—Sn material with the substrate. The larger island of FIG. 17 shows defects such as misfit dislocations and {111} stacking faults indicating that this material has exceeded a critical thickness beyond which the enormous strain is relieved by development of defects originating at the film/substrate interface. The combination of nanostructures and the technologically relevant Ge—Sn system is unique.

CONCLUSION

The above-described invention possesses numerous advantages as described herein. We have used low-temperature chemical vapor deposition to grow device quality single-crystal $Sn_xGe_{1-x}$ alloys with x=0.02-0.2 directly on Si substrates. The Sn is at substitutional sites in the underlying Ge lattice and in the high Sn content materials the systems are stabilized with the formation of orthorhombic superstructures. Optical measurements show a systematic narrowing of band gaps with increasing Sn concentration proving that band gap engineering has been achieved. Thus this new system should be an excellent candidate for a new generation of R photodetectors, with the critical additional benefit that they can be easily integrated into silicon-based technology. The invention in its broader aspects it not limited to the specific details, representative devices, and illustrative examples shown and described. Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A semiconductor structure comprising: a substrate and a $Sn_xGe_{1-x}$ layer formed directly on the substrate, wherein x has a value from about 0.02 to about 0.20, and wherein the substrate consists essentially of silicon.

2. The semiconductor structure of claim 1 wherein the $Sn_xGe_{1-x}$ layer is an epitaxial layer with a direct band gap between about 0.72 eV and about 0.041 eV.

3. The semiconductor structure of claim 1, wherein x has a value of about 0.20 and the $Sn_xGe_{1-x}$ layer is a direct-gap material.

4. The semiconductor structure of claim 1 wherein the substrate consists essentially of Si(100).

5. The semiconductor structure of claim 1 wherein the substrate consists essentially of Si(111).

6. The semiconductor structure of claim 1 wherein the $Sn_xGe_{1-x}$ layer has a thickness of about 50nm to about 1000nm.

7. The semiconductor structure of claim 1 further comprising a strained Ge layer formed over the $Sn_xGe_{1-x}$ layer.

8. The semiconductor structure of claim 7 wherein x is greater than about 0.11 and the strained Ge layer is a direct-gap material.

9. The semiconductor structure of claim 1, wherein the $Sn_xGe_{1-x}$ layer is relaxed.

10. The semiconductor structure of claim 1, wherein the $Sn_xGe_{1-x}$ layer is epitaxial.

11. The semiconductor structure of claim 10, wherein substrate is accommodated by Lomer edge dislocations.

12. The semiconductor structure of claim 1, wherein the $Sn_xGe_{1-x}$ layer lattice parameters are about 5.672 Å to about 5.833 Å.

13. The semiconductor structure of claim 1, wherein the $Sn_xGe_{1-x}$ layer is atomically flat.

14. A method for depositing an epitaxial Ge—Sn layer on a substrate in a chemical vapor deposition reaction chamber, the method comprising introducing into the chamber a gaseous precursor comprising $SnD_4$ under conditions whereby the epitaxial Ge—Sn layer is formed on the substrate.

15. The method of claim 14 wherein the gaseous precursor comprises $SnD_4$ and high purity $H_2$.

16. The method of claim 14 wherein the gaseous precursor further comprises high purity $H_2$ of about 15-20 by volume.

17. The method of claim 14 wherein the gaseous precursor is introduced at a temperature in a range of about 250° C. to about 350° C.

18. The method of claim 14 wherein the substrate comprises silicon.

19. The method of claim 14 wherein the substrate comprises Si(100).

20. The method of claim 14 wherein the Ge—Sn layer comprises $Sn_xGe_{1-x}$ and x is in a range from about 0.02 to about 0.20.

21. The method of claim 14 wherein the gaseous precursor comprises $SnD_4$ and $Ge_2H_6$.

22. A method for depositing a strained Ge layer on a silicon substrate with a Ge—Sn buffer layer in a chemical vapor deposition reaction chamber, the method comprising introducing into the chamber a combination comprising $SnD_4$ and $Ge_2H_6$ under conditions whereby the Ge—Sn layer is formed on the substrate and dehydrogenating $Ge_2H_6$ under conditions whereby the Ge layer is formed on the Ge—Sn buffer layer.

* * * * *